United States Patent
Bloomquist et al.

(10) Patent No.: US 9,809,713 B2
(45) Date of Patent: Nov. 7, 2017

(54) PHOTOACTIVATABLE CROSSLINKER COMPOSITIONS FOR SURFACE MODIFICATION

(75) Inventors: Timothy A. Bloomquist, Shoreview, MN (US); Mark W. Josephson, Welch, MN (US); Laurie R. Lawin, New Brighton, MN (US); Kristin S. Taton, Little Canada, MN (US); Jie Wen, Eden Prairie, MN (US)

(73) Assignee: INNOVATION SURFACE TECHNOLOGIES, INC., St. Paul, MN (US)

( * ) Notice: Subject to any disclaimer, the term of this patent is extended or adjusted under 35 U.S.C. 154(b) by 172 days.

(21) Appl. No.: 13/062,218

(22) PCT Filed: Sep. 3, 2009

(86) PCT No.: PCT/US2009/055814
§ 371 (c)(1),
(2), (4) Date: May 23, 2011

(87) PCT Pub. No.: WO2010/028104
PCT Pub. Date: Mar. 11, 2010

(65) Prior Publication Data
US 2011/0223336 A1  Sep. 15, 2011

Related U.S. Application Data

(60) Provisional application No. 61/094,472, filed on Sep. 5, 2008.

(51) Int. Cl.
| | |
|---|---|
| B05D 3/00 | (2006.01) |
| C09D 179/04 | (2006.01) |
| C09D 4/00 | (2006.01) |
| C08L 1/02 | (2006.01) |
| C08L 3/12 | (2006.01) |
| C08L 5/00 | (2006.01) |
| C08L 89/00 | (2006.01) |
| G03F 7/012 | (2006.01) |

(52) U.S. Cl.
CPC ............... *C09D 4/00* (2013.01); *C08L 1/02* (2013.01); *C08L 3/12* (2013.01); *C08L 5/00* (2013.01); *C08L 89/00* (2013.01); *G03F 7/012* (2013.01)

(58) Field of Classification Search
CPC ................................ B05D 3/00; C09D 179/04
USPC ......................... 427/331; 524/877; 522/167
See application file for complete search history.

(56) References Cited

U.S. PATENT DOCUMENTS

| | | | |
|---|---|---|---|
| 3,580,927 A | 5/1971 | Wear | |
| 5,637,460 A | 6/1997 | Swan et al. | |
| 5,714,360 A | 2/1998 | Swan et al. | |
| 7,989,619 B2* | 8/2011 | Guire | C08K 5/0025 252/301.23 |
| 2002/0004140 A1 | 1/2002 | Swan et al. | |
| 2003/0215649 A1 | 11/2003 | Jelle | |
| 2006/0018948 A1* | 1/2006 | Guire | A61L 31/06 424/426 |
| 2006/0204895 A1* | 9/2006 | Sailer | C08G 18/0823 430/273.1 |
| 2007/0003707 A1* | 1/2007 | Guire | C07C 275/10 427/508 |
| 2010/0081750 A1* | 4/2010 | Guire | C08K 5/0025 524/493 |

FOREIGN PATENT DOCUMENTS

| | | |
|---|---|---|
| JP | 57-042742 | 3/1982 |
| JP | 57-117564 | 7/1982 |
| JP | 59-043061 | 3/1984 |
| WO | WO 93/16176 A1 | 8/1993 |
| WO | WO 97/07161 A1 | 2/1997 |
| WO | WO 98/03489 | 1/1998 |
| WO | WO 01/40367 | 6/2001 |
| WO | WO 2005/097223 A1 | 10/2005 |
| WO | WO 2006/063181 A1 | 6/2006 |
| WO | WO 2006/135910 A1 | 12/2006 |

* cited by examiner

*Primary Examiner* — Dah-Wei D Yuan
*Assistant Examiner* — Hai Yan Zhang
(74) *Attorney, Agent, or Firm* — Weaver Legal and Consulting LLC; Karrie Gemignani Weaver

(57) ABSTRACT

The invention describes novel compositions of crosslinkers that include at least two pendent photoactivatable groups, such as benzophenone moieties, and an initiator, such as acetophenone.

13 Claims, No Drawings

PHOTOACTIVATABLE CROSSLINKER COMPOSITIONS FOR SURFACE MODIFICATION

CROSS REFERENCE TO RELATED APPLICATIONS

This application is a Section 371 National Stage Application of International No. PCT/US2009/055814, filed Sep. 3, 2009 and published as WO 2010/028104 A1 on Mar. 11, 2010, which claims priority from U.S. Provisional Application 61/094,472, filed Sep. 5, 2008, the contents of which are incorporated herein in their entirety for all purposes.

FIELD OF THE INVENTION

The invention relates generally to coatings that provide a surface that can be further functionalized. The coatings are generally formed from cross linking agents that provide at least two photoactivatable groups in combination with an initiator. The combinations are useful as surface coating agents alone or in combination with other target molecules such as polymers, biomolecules and the like.

BACKGROUND OF THE INVENTION

There exist many ways to coat, adhere, adsorb, modify, etc. a surface with a material, such that the material changes the characteristics of the surface. For example, suitable coatings can be prepared that when applied to a given surface render the surface hydrophobic or hydrophilic. In other instances, the coating may provide enhanced ability to bind with a target molecule, such as a protein.

In particular, there are known crosslinking materials that include a latent reactive group, such as a photoactivatable group. The crosslinking material has, in general, at least two photoactivatable groups, such that one group can be activated and attached to the surface of the substrate. The remaining latent group, can then later be, or simultaneously with the surface attachment, activated to react with a target molecule such as a polymer or a biomolecule.

Often the coating material does not adhere well to the substrate surface. This can be problematic where the coating does not remain intact during use.

Therefore, a continued need exists for coatings that can be tailored for desired properties.

BRIEF SUMMARY OF THE INVENTION

The present invention surprisingly provides enhanced coatings utilizing unique crosslinking molecule families that include pendent photoreactive (photoactivatable) groups and an initiator. Generally, the pendent photoreactive groups include free radical generators, nitrene and carbene generators or combinations thereof. It should be understood that at least two of the pendent photoreactive groups are present in the crosslinker, however, there can be multiple pendent photoreactive groups, e.g., 3, 4, 5, 6, . . . 5,000, etc.

It has been surprisingly found that coatings prepared from photoactivatable crosslinkers have enhanced performance in comparison to when an initiator is not used in the coating process. These compositions (of the photoactivatable crosslinker and the initiator) can be applied to a surface and then subjected to activation. Subsequent to the activation, the resultant coating (from the combination of photoactivatable crosslinker and initiator), referred to as a "primer" coating, provides a durable surface that adheres to the substrate surface. Further coating materials can then be applied to the primer coat to effect desired physical and chemical properties.

Suitable crosslinking agents include a wide variety of materials that include at least two photoactivatable groups attached to a molecule. The molecule can vary greatly from linear or branched aliphatic hydrocarbon chains, linear or branched unsaturated hydrocarbon chains, aromatic and polyaromatic moieties, sugars, polysaccharides, etc. The principle behind the photoactivatable crosslinker is that at least two photoactivatable moieties are attached to the molecule. Molecules can be functionalized with photoactivatable groups by methods known to the skilled artisan.

A general formula for photoactivable crosslinkers comprises:

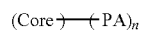

$(\text{Core})\!-\!(\text{PA})_n$ wherein "core" is a linear or branched alkyl group, a linear or branched alkyenyl group, an aryl group, a sugar substrate, a polysaccharide substrate, a peptide, a protein, a nucleic acid, an oligonucleotide, polyacrylics, polyvinyls, nylons, polyurethanes, or polyethers.

Each "PA", independently, is a photoactivatable group that can be an aryl ketone, an azide or nitrene generator, a free radical generator, a carbene generator or a diazo moiety.

"n" is an integer of at least 2, e.g., from about 2 to about 5,000, from about 2 to about 1,000, from about 2 to about 100, and in particular from 2 to about 50.

One composition of the invention includes

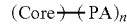

$(\text{Core})\!-\!(\text{PA})_n$ as described above and an initiator.

Another composition of the invention includes compounds having the formula:

$L\text{-}((D\text{-}T\text{-}C(R^1)(XP)CHR^2GR^3C(=O)R^4))_m.$

L is a linking group. D is O, S, SO, SO$_2$, NR$^5$ or CR$^6$R$^7$. T is $(-CH_2-)_x$, $(-CH_2CH_2-O-)_x$, $(-CH_2CH_2CH_2-O-)_x$, $(-CH_2CH_2CH_2CH_2-O-)_x$ or forms a bond. R$^1$ is a hydrogen atom, an alkyl, alkyloxyalkyl, aryl, aryloxyalkyl or aryloxyaryl group. X is O, S, or NR$^8$R$^9$. P is a hydrogen atom or a protecting group, with the provisio that P is absent when X is NR$^8$R$^9$. R$^2$ is a hydrogen atom, an alkyl, alkyloxyalkyl, aryl, aryloxylalkyl or aryloxyaryl group. G is O, S, SO, SO$_2$, NR$^{10}$, (CH$_2$)$_t$—O— or C=O. R$^3$ and R$^4$ are each independently an alkyl, aryl, arylalkyl, heteroaryl, or an heteroarylalkyl group, or optionally, R$^3$ and R$^4$ can be tethered together via $(-CH_2-)_q$, $(-CH_2-)_rC=O(-CH_2-)_s$, $(-CH_2-)_rS(-CH_2-)_s$, $(-CH_2-)_rS=O(-CH_2-)_s$, $(-CH_2-)_rS(O)_2(-CH_2-)_s$, or $(-CH_2-)_rNR(-CH_2-)_s$. R$^5$ and R$^{10}$ are each independently a hydrogen atom or an alkyl, aryl, or arylalkyl group. R$^6$ and R$^7$ are each independently a hydrogen atom, an alkyl, aryl, arylalkyl, heteroaryl or heteroarylalkyl group. R$^8$ and R$^9$ are each independently a hydrogen atom, an alkyl, aryl, or arylalkyl group, R is a hydrogen atom, an alkyl group or an aryl group, q is an integer from 1 to about 7, r is an integer from 0 to about 3, s is an integer from 0 to about 3, m is an integer from 2 to about 10, t is an integer from 1 to about 10 and x is an integer from 1 to about 500 and an initiator.

In one aspect, L is a branched or unbranched alkyl chain having between about 2 and about 10 carbon atoms.

In another aspect, D is an oxygen atom (O).

In still another aspect, T is (—CH$_2$—)$_x$ or (—CH$_2$CH$_2$—O—)$_x$ and x is 1 or 2.

In still yet another aspect, R$^1$ is a hydrogen atom.

In yet another aspect, X is an oxygen atom, O, and P is a hydrogen atom.

In another aspect, R$^2$ is a hydrogen atom.

In still another aspect, G is an oxygen atom, O.

In still yet another aspect, R$^3$ and R$^4$ are each individually aryl groups, which can be further substituted, and m is 3.

In one particular aspect, L is

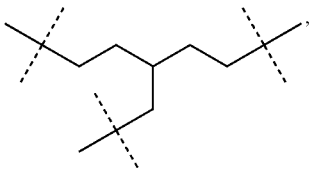

D is O, T is (—CH$_2$—)$_x$, R$^1$ is a hydrogen atom, X is O, P is a hydrogen atom, R$^2$ is a hydrogen atom, G is O, R$^3$ and R$^4$ are phenyl groups, m is 3 and x is 1.

In yet another particular aspect, L is (—CH$_2$—)$_y$, D is O, T is (—CH$_2$—)$_x$, R$^1$ is a hydrogen atom, X is O, P is a hydrogen atom, R$^2$ is a hydrogen atom, G is O, R$^3$ and R$^4$ are phenyl groups, m is 2, x is 1 and y is an integer from 2 to about 6, and in particular, y is 2, 4 or 6.

Another composition of the invention includes compounds having the formula:

L((T-C(R$^1$)(XP)CHR$^2$GR$^3$C(=O)R$^4$))$_m$.

L is a linking group. T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond. R$^1$ is a hydrogen atom, an alkyl, alkyloxyalkyl, aryl, aryloxyalkyl or aryloxyaryl group. X is O, S, or NR$^8$R$^9$. P is a hydrogen atom or a protecting group, with the provisio that P is absent when X is NR$^8$R$^9$. R$^2$ is a hydrogen atom, an alkyl, alkyloxyalkyl, aryl, aryloxyalkyl or aryloxyaryl group. G is O, S, SO, SO$_2$, NR$^{10}$, (CH$_2$)$_t$—O— or C=O. R$^3$ and R$^4$ are each independently an alkyl, aryl, arylalkyl, heteroaryl, or an heteroarylalkyl group, or optionally, R$^3$ and R$^4$ can be tethered together via (—CH$_2$—)$_q$, (—CH$_2$—)$_r$C=O(—CH$_2$—)$_s$, (—CH$_2$—)$_r$S(—CH$_2$—)$_s$, (—CH$_2$—)$_r$S=O(—CH$_2$—)$_s$, (—CH$_2$—)$_r$S(O)$_2$(—CH$_2$—)$_s$, or (—CH$_2$—)$_r$NR(—CH$_2$—)$_s$. R$^{10}$ is a hydrogen atom or an alkyl, aryl, or arylalkyl group. R$^8$ and R$^9$ are each independently a hydrogen atom, an alkyl, aryl, or arylalkyl group. R is a hydrogen atom, an alkyl group or an aryl group, q is an integer from 1 to about 7, r is an integer from 0 to about 3, s is an integer from 0 to about 3, m is an integer from 2 to about 10, t is an integer from 1 to about 10 and x is an integer from 1 to about 500 and an initiator.

In one aspect, L has a formula according to structure (I):

(I)

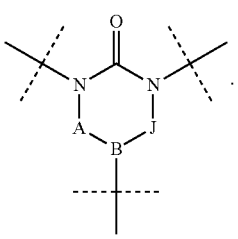

A and J are each independently a hydrogen atom, an alkyl group, an aryl group, or together with B form a cyclic ring, provided when A and J are each independently a hydrogen atom, an alkyl group, or an aryl group then B is not present, B is NR$^{11}$, O, or (—CH$_2$—)$_z$, provided when A, B and J form a ring, then A and J are (—CH$_2$—)$_z$ or C=O, R$^{11}$ is a hydrogen atom, an alkyl group, an aryl group or denotes a bond with T, each z independently is an integer from 0 to 3 and provided when either A or J is C=O then B is NR$^{11}$, O, or (—CH$_2$—)$_z$ and z must be at least 1.

In another aspect T is —CH$_2$—.

In still another aspect, R$^1$ is a hydrogen atom.

In still yet another aspect, X is O and P is a hydrogen atom.

In still another aspect, R$^2$ is a hydrogen atom.

In yet another aspect, G is O.

In another aspect, R$^3$ and R$^4$ are each individually aryl groups.

In still yet another aspect, m is 3, and in particular, A and J are both C=O and B is N or A and J are both hydrogen atoms.

A fourth composition of the invention includes compounds having the formula:

L-((TGQR$^3$C(=O)R$^4$))$_m$.

L is a linking group. T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond. G is O, S, SO, SO$_2$, NR$^{10}$, (CH$_2$)$_t$—O— or C=O. Q is (—CH$_2$—)$_p$, (—CH$_2$CH$_2$—O—)$_p$, —(CH$_2$CH$_2$CH$_2$—O—)$_p$ or (—CH$_2$CH$_2$CH$_2$CH$_2$—O—)$_p$. R$^3$ and R$^4$ are each independently an alkyl, aryl, arylalkyl, heteroaryl, or an heteroarylalkyl group, or optionally, R$^3$ and R$^4$ can be tethered together (—CH$_2$—)$_q$, (—CH$_2$—)$_r$C=O(—CH$_2$—)$_s$, (—CH$_2$—)$_r$S(—CH$_2$—)$_s$, (—CH$_2$—)$_r$S=O(—CH$_2$—)$_s$, (—CH$_2$—)$_r$S(O)$_2$(—CH$_2$—)$_s$, or (—CH$_2$—)$_r$NR(—CH$_2$—)$_s$. R$^{10}$ is a hydrogen atom or an alkyl, aryl, alkylaryl or arylalkyl group. R is a hydrogen atom, an alkyl group or an aryl group, q is an integer from 1 to about 7, r is an integer from 0 to about 3, s is an integer from 0 to about 3, m is an integer from 2 to about 10, p is an integer from 1 to about 10, t is an integer from 1 to about 10 and x is an integer from 1 to about 500 and an initiator.

In one aspect, L has a formula according to structure (I):

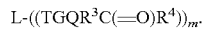

(I)

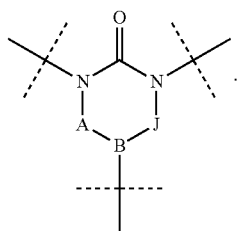

A and J are each independently a hydrogen atom, an alkyl group, an aryl group, or together with B form a cyclic ring, provided when A and J are each independently a hydrogen atom, an alkyl group, or an aryl group then B is not present, B is NR$^{11}$, O, or (—CH$_2$—)$_z$, provided when A, B and J form a ring, then A and J are (—CH$_2$—)$_z$ or C=O, R$^{11}$ is a hydrogen atom, an alkyl group, an aryl group or denotes a bond with T, each z independently is an integer from 0 to 3 and provided when either A or J is C=O, then B is NR$^{11}$, O, or (—CH$_2$—)$_z$ and z must be at least 1.

In one aspect, T is —CH$_2$—.

In another aspect, G is an oxygen atom, O.

In still another aspect, R$^3$ and R$^4$ are each individually aryl groups, which can be substituted, and m is 2.

In still yet another aspect, A and J are both C=O and B is NR$^{11}$.

In another aspect, A and J are both hydrogen atoms.

In yet another aspect, L has a formula according to structure (II):

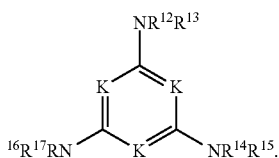

(II)

R$^{12}$, R$^{13}$, R$^{14}$, R$^{15}$, R$^{16}$, R$^{17}$ are each independently a hydrogen atom, an alkyl or aryl group or denotes a bond with T, provided at least two of R$^{12}$, R$^{13}$, R$^{14}$, R$^{15}$, R$^{16}$, R$^{17}$ are bonded with T and each K, independently is CH or N.

A fifth composition includes compounds having the formula:

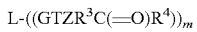

L is a linking group. T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond. G is O, S, SO, SO$_2$, NR$^{10}$, (CH$_2$)$_t$—O— or C=O. Z can be a C=O, COO or CONH when T is (—CH$_2$—)$_x$. R$^3$ and R$^4$ are each independently an alkyl, aryl, arylalkyl, heteroaryl, or an heteroarylalkyl group, or optionally, R$^3$ and R$^4$ can be tethered together via (—CH$_2$—)$_q$, (—CH$_2$—)$_r$C=O(—CH$_2$—)$_s$, (—CH$_2$—)$_r$—S (—CH$_2$—)$_s$, (—CH$_2$—)$_r$S=O(—CH$_2$—)$_s$, (—CH$_2$—)$_r$S (O)$_2$(—CH$_2$—)$_s$, or (—CH$_2$—)$_r$NR(—CH$_2$—)$_s$. R$^{10}$ is a hydrogen atom or an alkyl, aryl, alkylaryl or arylalkyl group. R is a hydrogen atom, an alkyl group or an aryl group, q is an integer from 1 to about 7, r is an integer from 0 to about 3, s is an integer from 0 to about 3, m is an integer from 2 to about 10, p is an integer from 1 to about 10, t is an integer from 1 to about 10 and x is an integer from 1 to about 500 and an initiator.

In one aspect, L has a formula according to structure (I):

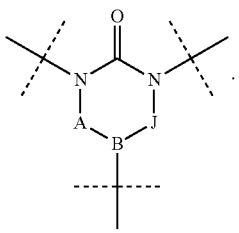

(I)

A and J are each independently a hydrogen atom, an alkyl group, an aryl group, or together with B form a cyclic ring, provided when A and J are each independently a hydrogen atom, an alkyl group, or an aryl group then B is not present, B is NR$^{11}$, O, or (—CH$_2$—)$_z$, provided when A, B and J form a ring, then A and J are (—CH$_2$—)$_z$ or C=O, R$^{11}$ is a hydrogen atom, an alkyl group, an aryl group or denotes a bond with T, each z independently is an integer from 0 to 3 and provided when either A or J is C=O, then B is NR$^{11}$, O, or (—CH$_2$—)$_z$ and z must be at least 1.

In one aspect, T is —CH$_2$—.

In another aspect, G is an oxygen atom, O.

In still another aspect, R$^3$ and R$^4$ are each individually aryl groups, which can be substituted, and m is 2.

In still yet another aspect, A and J are both C=O and B is NR$^{11}$.

In another aspect, A and J are both hydrogen atoms.

In yet another aspect, L has a formula according to structure (II):

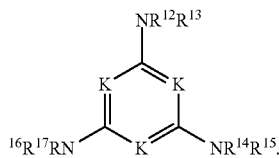

(II)

R$^{12}$, R$^{13}$, R$^{14}$, R$^{15}$, R$^{16}$, R$^{17}$ are each independently a hydrogen atom, an alkyl or aryl group or denotes a bond with T, provided at least two of R$^{12}$, R$^{13}$, R$^{14}$, R$^{15}$, R$^{16}$, R$^{17}$ are bonded with T and each K, independently is CH or N.

In still yet another aspect, compounds of the present invention provide that R$^3$ and R$^4$ are both phenyl groups and are tethered together via a CO, a S or a CH$_2$.

In yet another aspect, compounds of the present invention provide when R$^3$ and R$^4$ are both phenyl group, the phenyl groups can be substituted with at least one CH$_3$OCH$_2$CH$_2$O—.

The resultant primer coatings of the invention have broad applications. The primer coatings can be used in surface modifications.

The inclusion of photoreactive moieties within the crosslinker provides that the compositions can be used with a wide range of support surfaces. The compositions can be used alone or in combination with other materials to provide a desired surface characteristic. The compositions, alone or in combination with another material, provides the treated surface having a modified property suitable for further functionalization, such as a subsequent coating.

An advantage of the compositions of the invention (the crosslinker plus initiator) is that is has been surprisingly found less crosslinking agent is required to effect coating properties than when a crosslinking agent is used alone. This helps reduce the cost of the coating as initiators are relatively inexpensive when compared to the cost of preparing suitable crosslinking agents described herein. Additionally, the physical properties of the primer coatings prepared herein are improved relative to primer coatings where only the crosslinking agent is used in the absence of an initiator.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed descriptions are to be regarded as illustrative in nature and not restrictive.

DETAILED DESCRIPTION

The present invention surprisingly provides unique coatings, referred to herein as "primer coatings" that produced from the reaction(s) of crosslinking molecule families that include at least two photoactivatable groups and an initiator.

The compositions of the invention are useful as coatings. The compositions can be provided as "kits", wherein the crosslinker is provided in one container and the initiator is provided in a second container, or they can be provided together in one container. The composition is applied to a suitable substrate which is then subjected to an energy source sufficient to cause the initiator and/or crosslinker to react and provide the primer coating.

In the specification and in the claims, the terms "including" and "comprising" are open-ended terms and should be interpreted to mean "including, but not limited to . . . ." These terms encompass the more restrictive terms "consisting essentially of" and "consisting of."

It must be noted that as used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

Unless defined otherwise, all technical and scientific terms used herein have the same meanings as commonly understood by one of ordinary skill in the art to which this invention belongs. All publications and patents specifically mentioned herein are incorporated by reference in their entirety for all purposes including describing and disclosing the chemicals, instruments, statistical analyses and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

The phrase "primer coating" is intended to mean the resultant coating that is obtained from the combination of a photoactivatable crosslinker (also referred to as a crosslinking agent or crosslinker) and an initiator, generally referred to as a "composition" of the invention. The crosslinker includes two or more pendant photoactive groups, described in detail herein, that are free radical generators, nitrene or carbene generators or combinations thereof, and include aryl ketones, azide/nitrene generators, chlorogenerating moieties (a free radical generator), carbene generators or diazo moieties. The term "primer" should not be construed as limiting but it only used to differentiate the subject coatings of the invention and subsequent coatings that can be applied to the coatings described herein.

The crosslinker can take on various forms, such as those described herein. The crosslinker includes at least two (2) pendant photoactive groups. A general formula for photoactivable crosslinkers comprises:

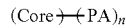

wherein "core" is a linear or branched alkyl group, a linear or branched alkyenyl group, an aryl group, a sugar substrate, a polysaccharide substrate, a peptide, a protein, a nucleic acid, an oligonucleotide, polyacrylics, polyvinyls, nylons, polyurethanes, or polyethers.

Each "PA", independently, is a photoactivatable group that can be an aryl ketone, an azide or nitrene generator, a free radical generator, a carbene generator or a diazo moiety.

"n" is an integer from at least 2 to about 5,000, for example from at least 2 to about 1,000, from at least 2 to about 500, from at least 2 to about 100, including all integers and ranges from at least 2 and 5,000, e.g., from about 3 to about 5,000, from about 4 to about 5,000, from at least 2 to about 4,999, etc.

Additionally, suitable photoactivatable crosslinkers include those described in U.S. Pat. Nos. 5,414,075; 5,637,460; 5,714,360; 6,077,698; and 6,278,018, the contents of which are incorporated herein in their entirety for all purposes and most particularly column 5, line 1 through line 15 and column 8, line 5 through line 30 of U.S. Pat. No. 5,414,075; column 5, line 1 through line 24 and column 8, line 1 through line 20 of U.S. Pat. No. 5,637,460; column 5 through column 8 and column 9, line 1 through line 40 of U.S. Pat. No. 5,714,360; column 7 through column 8 and column 9, line 1 through line 40 of U.S. Pat. No. 6,077,698; column 3 through column 4 and column 5, line 1 through line 28 of U.S. Pat. No. 6,278,018; and column 5, line 1 through line 15 and column 8, line 5 through line 30 of U.S. Pat. No. 5,414,075.

In one aspect, use of photoreactive (photoactive) species as pendent groups within the crosslinkers described herein are generally in the form of photoreactive aryl ketones moieties, such as acetophenone, benzophenone, anthraquinone, anthrone, and anthrone-like heterocycles (i.e., heterocyclic analogs of anthrone such as those having N, O, or S in the 10-position), or their substituted (e.g., ring substituted) derivatives. Examples of aryl ketones include heterocyclic derivatives of anthrone, including acridone, xanthone, and thioxanthone, and their ring substituted derivatives. In particular, thioxanthone, and its derivatives, having excitation wavelengths greater than about 360 nm are useful.

The functional groups of ketones are preferred since they are readily capable of undergoing an activation/inactivation/reactivation cycle. Benzophenone is a photoreactive moiety, since it is capable of photochemical excitation with the initial formation of an excited singlet state that undergoes intersystem crossing to the triplet state. The excited triplet state can insert into carbon-hydrogen bonds by abstraction of a hydrogen atom (from a support surface, for example), thus creating a radical pair. Subsequent collapse of the radical pair leads to formation of a new carbon-carbon bond. If a reactive bond (e.g., carbon-hydrogen) is not available for bonding, the ultraviolet light-induced excitation of the benzophenone group is reversible and the molecule returns to ground state energy level upon removal of the energy source. Photoactivatible aryl ketones such as benzophenone and acetophenone are of particular importance inasmuch as these groups are subject to multiple reactivation in water and hence provide increased coating efficiency.

It should be understood that with reference to a photoreactive moiety, the pendant photoreactive groups include free radical generators, nitrene and carbene generators or combinations thereof, as being part of the crosslinker, that the photoreactive moiety is attached to the remainder of the crosslinker via a bond or a linking group that joins the photoreactive moiety to the remainder of the molecule. In other words, for example, there are benzophenone fragments that are included in the crosslinker, such that the ketone functionality remains.

In one embodiment the crosslinker has the formula:

L is a linking group. D is O, S, SO, $SO_2$, $NR^5$ or $CR^6R^7$. T is $(-CH_2-)_x$, $(-CH_2CH_2-O-)_x$, $(-CH_2CH_2CH_2-O-)_x$, $(-CH_2CH_2CH_2CH_2-O-)_x$ or forms a bond. $R^1$ is a hydrogen atom, an alkyl, alkyloxyalkyl, aryl, aryloxyalkyl or aryloxyaryl group. X is O, S, or $NR^8R^9$. P is a hydrogen atom or a protecting group, with the provisio that P is absent when X is NR$^8$R$^9$. R$^2$ is a hydrogen atom, an alkyl, alkyloxyalkyl, aryl, aryloxylalkyl or aryloxyaryl group. G is O, S, SO, SO$_2$, NR$^{10}$, (CH$_2$)$_t$—O— or C=O. R$^3$ and R$^4$ are each independently an alkyl, aryl, arylalkyl, heteroaryl, or a heteroarylalkyl group, or optionally, R$^3$ and R$^4$ can be tethered together via (—CH$_2$—)$_q$, (—CH$_2$—)$_r$C=O(—CH$_2$—)$_s$, (—CH$_2$—)$_r$S(—CH$_2$—)$_s$, (—CH$_2$—)$_r$S=O(—CH$_2$—)$_s$, (—CH$_2$—)$_r$S(O)$_2$(—CH$_2$—)$_s$, or (—CH$_2$—)$_r$NR(—CH$_2$—)$_s$. R$^5$ and R$^{10}$ are each independently a hydrogen atom or an alkyl, aryl, or arylalkyl group. R$^6$ and R$^7$ are each independently a hydrogen atom, an alkyl, aryl, arylalkyl, heteroaryl or heteroarylalkyl group. R$^8$ and R$^9$ are each independently a hydrogen atom, an alkyl, aryl, or arylalkyl group, R is a hydrogen atom, an alkyl group or an aryl group, q is an integer from 1 to about 7, r is an integer from 0 to about 3, s is an integer from 0 to about 3, m is an integer from 2 to about 10, t is an integer from 1 to about 10 and x is an integer from 1 to about 500.

In one aspect, L is a branched or unbranched alkyl chain having between about 2 and about 10 carbon atoms.

In another aspect, D is an oxygen atom (O).

In still another aspect, T is (—CH$_2$—)$_x$ or (—CH$_2$CH$_2$—O—)$_x$ and x is 1 or 2.

In still yet another aspect, R$^1$ is a hydrogen atom.

In yet another aspect, X is an oxygen atom, O, and P is a hydrogen atom.

In another aspect, R$^2$ is a hydrogen atom.

In still another aspect, G is an oxygen atom, O.

In still yet another aspect, R$^3$ and R$^4$ are each individually aryl groups, which can be further substituted, and m is 3.

In one particular aspect, L is

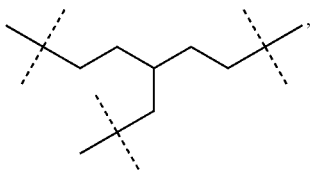

D is O, T is (—CH$_2$—)$_x$, R$^1$ is a hydrogen atom, X is O, P is a hydrogen atom, R$^2$ is a hydrogen atom, G is O, R$^3$ and R$^4$ are phenyl groups, m is 3 and x is 1.

In yet another particular aspect, L is (—CH$_2$—)$_y$, D is O, T is (—CH$_2$—)$_x$, R$^1$ is a hydrogen atom, X is O, P is a hydrogen atom, R$^2$ is a hydrogen atom, G is O, R$^3$ and R$^4$ are phenyl groups, m is 2, x is 1 and y is an integer from 2 to about 6, and in particular, y is 2, 4 or 6.

In certain embodiments, x is an integer from about 1 to about 500, more particularly from about 1 to about 400, from about 1 to about 250, from about 1 to about 200, from about 1 to about 150, from about 1 to about 100, from about 1 to about 50, from about 1 to about 25 or from about 1 to about 10

In another embodiment, the crosslinker has the formula:

L((T-C(R$^1$)(XP)CHR$^2$GR$^3$C(=O)R$^4$))$_m$.

wherein L, T, R$^1$, X, P, R$^2$, G, R$^3$, R$^4$, R$^8$, R$^9$, R$^{10}$, R, q, r, s, m, t and x are as defined above.

In one aspect, L has a formula according to structure (I):

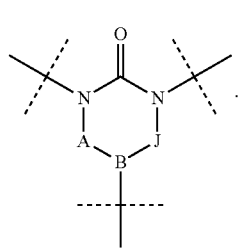

(I)

A and J are each independently a hydrogen atom, an alkyl group, an aryl group, or together with B form a cyclic ring, provided when A and J are each independently a hydrogen atom, an alkyl group, or an aryl group then B is not present, B is NR$^{11}$, O, or (—CH$_2$—)$_z$, provided when A, B and J form a ring, then A and J are (—CH$_2$—)$_z$ or C=O, R$^{11}$ is a hydrogen atom, an alkyl group, an aryl group or denotes a bond with T, each z independently is an integer from 0 to 3 and provided when either A or J is C=O, then B is NR$^{11}$, O, or (—CH$_2$—)$_z$ and z must be at least 1.

In another aspect T is —CH$_2$—.

In another embodiment, the family has the formula:

L-((GTZR$^3$C(=O)R$^4$))$_m$ wherein L, T, G, R$^3$, R$^4$, R$^{10}$, R, q, r, s, m, t and x are as defined above. Z can be a C=O, COO or CONH when T is (—CH$_2$—)$_x$.

In one aspect, L has a formula according to structure (I):

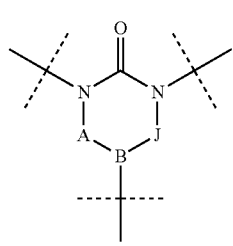

(I)

wherein A, B, J, R$^{11}$, and z are as defined above.

In another aspect, L has a formula according to structure (II):

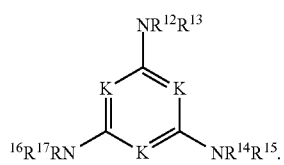

(II)

R$^{12}$, R$^{13}$, R$^{14}$, R$^{15}$, R$^{16}$, R$^{17}$ are each independently a hydrogen atom, an alkyl or aryl group or denotes a bond with T, provided at least two of R$^{12}$, R$^{13}$, R$^{14}$, R$^{15}$, R$^{16}$, R$^{17}$ are bonded with T and each K, independently is CH or N.

In another embodiment, the crosslinker has the formula:

L-((TGQR$^3$C(=O)R$^4$))$_m$ wherein L, G, R$^3$, R$^4$, R$^{10}$, R, q, r, s, m, t and x are as defined above. T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond. Q is (—CH$_2$—)$_p$, (—CH$_2$CH$_2$—O—)$_p$, (—CH$_2$CH$_2$CH$_2$—O—)$_p$ or (—CH$_2$CH$_2$CH$_2$CH$_2$—O—)$_p$ and p is an integer from 1 to about 10.

In one aspect, L has a formula according to structure (I):

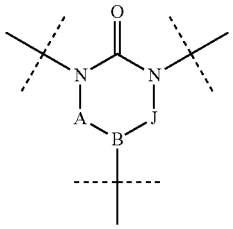

(I)

wherein A, B, J, R$^{11}$, and z are as defined above.

In another aspect, L has a formula according to structure (II):

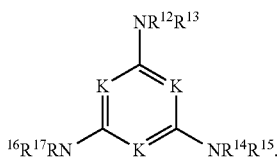

(II)

R$^{12}$, R$^{13}$, R$^{14}$, R$^{15}$, R$^{16}$, R$^{17}$ are each independently a hydrogen atom, an alkyl or aryl group or denotes a bond with T, provided at least two of R$^{12}$, R$^{13}$, R$^{14}$, R$^{15}$, R$^{16}$, R$^{17}$ are bonded with T and each K, independently is CH or N.

In still yet another aspect, compounds of the present invention provide that R$^3$ and R$^4$ are both phenyl groups and are tethered together via a CO, a S or a CH$_2$.

In yet another aspect, compounds of the present invention provide when R$^3$ and R$^4$ are phenyl groups, the phenyl groups can each independently be substituted with at least one alkyloxyalkyl group, such as CH$_3$O—(CH$_2$CH$_2$O)$_n$—, or CH$_3$O(—CH$_2$CH$_2$CH$_2$O—)$_n$-a hydroxylated alkoxy group, such as HO—CH$_2$CH$_2$O—, HO(—CH$_2$CH$_2$O—)$_n$— or HO(—CH$_2$CH$_2$CH$_2$O—)$_n$—, etc. wherein n is an integer from 1 to about 10.

In another embodiment the crosslinker has the formula:

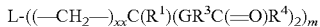

wherein L, each R, R$^1$, each G, each R$^3$, each R$^4$, each R$^{10}$, each q, each r, each s, each t and m are as defined above and xx is an integer from 1 to about 10.

In one aspect, L has a formula according to structure (I):

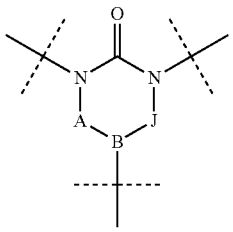

(I)

wherein A, B, J, R$^{11}$, and z are as defined above.

In another aspect, A and B are both hydrogen atoms.

In still another aspect, xx is 1.

In yet another aspect, R$^1$ is H.

In still yet another aspect, G is (—CH$_2$—)$_t$O— and t is 1.

In another aspect, R$^3$ and R$^4$ are each individually aryl groups.

In still yet another embodiment, xx is 1, R$^1$ is H, each G is (—CH$_2$—)$_t$O—, t is 1 and each of R$^3$ and R$^4$ are each individually aryl groups.

In another embodiment, the crosslinker has the formula

where L, R, R$^1$, R$^2$, R$^3$, R$^4$, R$^8$, R$^9$, R$^{10}$, X, P, G, q, r, s, t, and m are as defined above.

In one aspect, L is

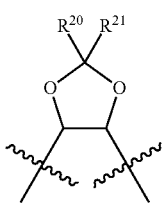

and R$^{20}$ and R$^{21}$ are each individually a hydrogen atom, an alkyl group or an aryl group.

In another aspect, R$^1$ is H.

In still another aspect, wherein X is O.

In yet another aspect, P is H.

In still yet another aspect, R$^2$ is H.

In another aspect, G is (—CH$_2$—)tO— and t is 1.

In still another aspect, R$^3$ and R$^4$ are each individually aryl groups.

In yet another aspect, R$^1$ is H, X is O, P is H, R$^2$ is H, G is (—CH$_2$—)$_t$O—, t is 1, R$^3$ and R$^4$ are each individually aryl groups and R$^{20}$ and R$^{21}$ are both methyl groups.

In yet another embodiment, the crosslinker has the formula:

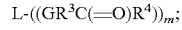

where L, G, R, R$^3$, R$^4$, R$^{10}$, q, r, s, m and t are as defined above.

In one aspect, L is

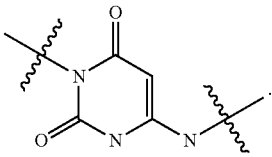 [SMILES: *Nc1cc(=O)n(*)c(=O)[nH]1]

In another aspect, G is C═O.

In still another aspect, R$^3$ and R$^4$ are each individually aryl groups.

In yet another aspect, G is C═O and R$^3$ and R$^4$ are each individually aryl groups.

"Alkyl" by itself or as part of another substituent refers to a saturated or unsaturated branched, straight-chain or cyclic monovalent hydrocarbon radical having the stated number of carbon atoms (i.e., C$_1$-C$_6$ means one to six carbon atoms) that is derived by the removal of one hydrogen atom from a single carbon atom of a parent alkane, alkene or alkyne. Typical alkyl groups include, but are not limited to, methyl; ethyls such as ethanyl, ethenyl, ethynyl; propyls such as propan-1-yl, propan-2-yl, cyclopropan-1-yl, prop-1-en-1-yl, prop-1-en-2-yl, prop-2-en-1-yl, cycloprop-1-en-1-yl; cycloprop-2-en-1-yl, prop-1-yn-1-yl, prop-2-yn-1-yl, etc.; butyls such as butan-1-yl, butan-2-yl, 2-methyl-propan-1-yl, 2-methyl-propan-2-yl, cyclobutan-1-yl, but-1-en-1-yl, but-1-en-2-yl, 2-methyl-prop-1-en-1-yl, but-2-en-1-yl, but-2-en-2-yl, buta-1,3-dien-1-yl, buta-1,3-dien-2-yl, cyclobut-1-en-1-yl, cyclobut-1-en-3-yl, cyclobuta-1,3-dien-1-yl, but-1-yn-1-yl, but-1-yn-3-yl, but-3-yn-1-yl, etc.; and the like. Where specific levels of saturation are intended, the nomenclature "alkanyl," "alkenyl" and/or "alkynyl" is used, as defined below. "Lower alkyl" refers to alkyl groups having from 1 to 6 carbon atoms.

"Alkanyl" by itself or as part of another substituent refers to a saturated branched, straight-chain or cyclic alkyl derived by the removal of one hydrogen atom from a single carbon atom of a parent alkane. Typical alkanyl groups include, but are not limited to, methanyl; ethanyl; propanyls such as propan-1-yl, propan-2-yl (isopropyl), cyclopropan-1-yl, etc.; butanyls such as butan-1-yl, butan-2-yl (sec-butyl), 2-methyl-propan-1-yl (isobutyl), 2-methyl-propan-2-yl (t-butyl), cyclobutan-1-yl, etc.; and the like.

"Alkenyl" by itself or as part of another substituent refers to an unsaturated branched, straight-chain or cyclic alkyl having at least one carbon-carbon double bond derived by the removal of one hydrogen atom from a single carbon atom of a parent alkene. The group may be in either the cis or trans conformation about the double bond(s). Typical alkenyl groups include, but are not limited to, ethenyl; propenyls such as prop-1-en-1-yl, prop-1-en-2-yl, prop-2-en-1-yl, prop-2-en-2-yl, cycloprop-1-en-1-yl; cycloprop-2-en-1-yl; butenyls such as but-1-en-1-yl, but-1-en-2-yl, 2-methyl-prop-1-en-1-yl, but-2-en-1-yl, but-2-en-2-yl, buta-1,3-dien-1-yl, buta-1,3-dien-2-yl, cyclobut-1-en-1-yl, cyclobut-1-en-3-yl, cyclobuta-1,3-dien-1-yl, etc.; and the like.

"Alkyloxyalkyl" refers to a moiety having two alkyl groups tethered together via an oxygen bond. Suitable alkyloxyalkyl groups include polyoxyalkylenes, such as polyethyleneoxides, polypropyleneoxides, etc. that are terminated with an alkyl group, such as a methyl group. A general formula for such compounds can be depicted as R'—(OR")$_n$ or (R'O)$_n$R" wherein n is an integer from 1 to about 10, and R' and R" are alkyl or alkylene groups.

"Alkynyl" by itself or as part of another substituent refers to an unsaturated branched, straight-chain or cyclic alkyl having at least one carbon-carbon triple bond derived by the removal of one hydrogen atom from a single carbon atom of a parent alkyne. Typical alkynyl groups include, but are not limited to, ethynyl; propynyls such as prop-1-yn-1-yl, prop-2-yn-1-yl, etc.; butynyls such as but-1-yn-1-yl, but-1-yn-3-yl, but-3-yn-1-yl, etc.; and the like.

"Alkyldiyl" by itself or as part of another substituent refers to a saturated or unsaturated, branched, straight-chain or cyclic divalent hydrocarbon group having the stated number of carbon atoms (i.e., C1-C6 means from one to six carbon atoms) derived by the removal of one hydrogen atom from each of two different carbon atoms of a parent alkane, alkene or alkyne, or by the removal of two hydrogen atoms from a single carbon atom of a parent alkane, alkene or alkyne. The two monovalent radical centers or each valency of the divalent radical center can form bonds with the same or different atoms. Typical alkyldiyl groups include, but are not limited to, methandiyl; ethyldiyls such as ethan-1,1-diyl, ethan-1,2-diyl, ethen-1,1-diyl, ethen-1,2-diyl; propyldiyls such as propan-1,1-diyl, propan-1,2-diyl, propan-2,2-diyl, propan-1,3-diyl, cyclopropan-1,1-diyl, cyclopropan-1,2-diyl, prop-1-en-1,1-diyl, prop-1-en-1,2-diyl, prop-2-en-1,2-diyl, prop-1-en-1,3-diyl, cycloprop-1-en-1,2-diyl, cyclo-prop-2-en-1,2-diyl, cycloprop-2-en-1,1-diyl, prop-1-yn-1,3-diyl, etc.; butyldiyls such as, butan-1,1-diyl, butan-1,2-diyl, butan-1,3-diyl, butan-1,4-diyl, butan-2,2-diyl, 2-methyl-propan-1,1-diyl, 2-methyl-propan-1,2-diyl, cyclobutan-1,1-diyl; cyclobutan-1,2-diyl, cyclobutan-1,3-diyl, but-1-en-1,1-diyl, but-1-en-1,2-diyl, but-1-en-1,3-diyl, but-1-en-1,4-diyl, 2-methyl-prop-1-en-1,1-diyl, 2-methanylidene-propan-1,1-diyl, buta-1,3-dien-1,1-diyl, buta-1,3-dien-1,2-diyl, buta-1,3-dien-1,3-diyl, buta-1,3-dien-1,4-diyl, cyclobut-1-en-1,2-diyl, cyclobut-1-en-1,3-diyl, cyclobut-2-en-1,2-diyl, cyclobuta-1,3-dien-1,2-diyl, cyclobuta-1,3-dien-1,3-diyl, but-1-yn-1,3-diyl, but-1-yn-1,4-diyl, buta-1,3-diyn-1,4-diyl, etc.; and the like. Where specific levels of saturation are intended, the nomenclature alkanyldiyl, alkenyldiyl and/or alkynyldiyl is used. Where it is specifically intended that the two valencies be on the same carbon atom, the nomenclature "alkylidene" is used. A "lower alkyldiyl" is an alkyldiyl group having from 1 to 6 carbon atoms. In preferred embodiments the alkyldiyl groups are saturated acyclic alkanyldiyl groups in which the radical centers are at the terminal carbons, e.g., methandiyl(methano); ethan-1,2-diyl (ethano); propan-1,3-diyl(propano); butan-1,4-diyl(butano); and the like (also referred to as alkylenes, defined infra).

"Alkylene" by itself or as part of another substituent refers to a straight-chain saturated or unsaturated alkyldiyl group having two terminal monovalent radical centers derived by the removal of one hydrogen atom from each of the two terminal carbon atoms of straight-chain parent alkane, alkene or alkyne. The locant of a double bond or triple bond, if present, in a particular alkylene is indicated in square brackets. Typical alkylene groups include, but are not limited to, methylene (methano); ethylenes such as ethano, etheno, ethyno; propylenes such as propano, prop[1]eno, propa[1,2]dieno, prop[1]yno, etc.; butylenes such as butano, but[1]eno, but[2]eno, buta[1,3]dieno, but[1]yno, but[2]yno, buta[1,3]diyno, etc.; and the like. Where specific levels of saturation are intended, the nomenclature alkano, alkeno and/or alkyno is used. In preferred embodiments, the alkylene group is (C1-C6) or (C1-C3)alkylene. Also preferred are straight-chain saturated alkano groups, e.g., methano, ethano, propano, butano, and the like.

"Aryl" by itself or as part of another substituent refers to a monovalent aromatic hydrocarbon group having the stated number of carbon atoms (i.e., C5-C15 means from 5 to 15 carbon atoms) derived by the removal of one hydrogen atom from a single carbon atom of a parent aromatic ring system. Typical aryl groups include, but are not limited to, groups derived from aceanthrylene, acenaphthylene, acephenanthrylene, anthracene, azulene, benzene, chrysene, coronene, fluoranthene, fluorene, hexacene, hexaphene, hexylene, αs-indacene, s-indacene, indane, indene, naphthalene, octacene, octaphene, octalene, ovalene, penta-2,4-diene, pentacene, pentalene, pentaphene, perylene, phenalene, phenanthrene, picene, pleiadene, pyrene, pyranthrene, rubicene, triphenylene, trinaphthalene, and the like, as well as the various hydro isomers thereof. In preferred embodiments, the aryl group is (C5-C15) aryl, with (C5-C10) being even more preferred. Particularly preferred aryls are phenyl and naphthyl.

"Arylalkyl" by itself or as part of another substituent refers to an acyclic alkyl radical in which one of the hydrogen atoms bonded to a carbon atom, typically a terminal or sp$^3$ carbon atom, is replaced with an aryl group. Typical arylalkyl groups include, but are not limited to, benzyl, 2-phenylethan-1-yl, 2-phenylethen-1-yl, naphthylmethyl, 2-naphthylethan-1-yl, 2-naphthylethen-1-yl, naphthobenzyl, 2-naphthophenylethan-1-yl and the like. Where specific alkyl moieties are intended, the nomenclature arylalkanyl, arylalkenyl and/or arylalkynyl is used. Preferably, an arylalkyl group is $(C_7-C_{30})$arylalkyl, e.g., the alkanyl, alkenyl or alkynyl moiety of the arylalkyl group is $(C_1-C_{10})$ and the aryl moiety is $(C_6-C_{20})$, more preferably, an arylalkyl group is $(C_7-C_{20})$arylalkyl, e.g., the alkanyl, alkenyl or alkynyl moiety of the arylalkyl group is $(C_1-C_8)$ and the aryl moiety is $(C_6-C_{12})$.

"Aryloxyalkyl" refers to a moiety having an aryl group and an alkyl group tethered together via an oxygen bond. Suitable aryloxyalkyl groups include phenyloxyalkylenes, such as methoxyphenyl, ethoxyphenyl, etc.

"Cycloalkyl" by itself or as part of another substituent refers to a cyclic version of an "alkyl" group. Typical cycloalkyl groups include, but are not limited to, cyclopropyl; cyclobutyls such as cyclobutanyl and cyclobutenyl; cyclopentyls such as cyclopentanyl and cycloalkenyl; cyclohexyls such as cyclohexanyl and cyclohexenyl; and the like.

"Cycloheteroalkyl" by itself or as part of another substituent refers to a saturated or unsaturated cyclic alkyl radical in which one or more carbon atoms (and any associated hydrogen atoms) are independently replaced with the same or different heteroatom. Typical heteroatoms to replace the carbon atom(s) include, but are not limited to, N, P, O, S, Si, etc. Where a specific level of saturation is intended, the nomenclature "cycloheteroalkanyl" or "cycloheteroalkenyl" is used. Typical cycloheteroalkyl groups include, but are not limited to, groups derived from epoxides, imidazolidine, morpholine, piperazine, piperidine, pyrazolidine, pyrrolidine, quinuclidine, and the like.

"Halogen" or "Halo" by themselves or as part of another substituent, unless otherwise stated, refer to fluoro, chloro, bromo and iodo.

"Haloalkyl" by itself or as part of another substituent refers to an alkyl group in which one or more of the hydrogen atoms are replaced with a halogen. Thus, the term "haloalkyl" is meant to include monohaloalkyls, dihaloalkyls, trihaloalkyls, etc. up to perhaloalkyls. For example, the expression "(C1-C2)haloalkyl" includes fluoromethyl, difluoromethyl, trifluoromethyl, 1-fluoroethyl, 1,1-difluoroethyl, 1,2-difluoroethyl, 1,1,1-trifluoroethyl, perfluoroethyl, etc.

"Heteroalkyl, Heteroalkanyl, Heteroalkenyl, Heteroalkynyl" by itself or as part of another substituent refer to alkyl, alkanyl, alkenyl and alkynyl radical, respectively, in which one or more of the carbon atoms (and any associated hydrogen atoms) are each independently replaced with the same or different heteroatomic groups. Typical heteroatomic groups include, but are not limited to, —O—, —S—, —O—O—, —S—S—, —O—S—, —NR'—, =N—N=, —N=N—, —N=N—NR'—, —PH—, —P(O)$_2$—, —O—P(O)$_2$—, —S(O)—, —S(O)$_2$—, —SnH$_2$— and the like, where R' is hydrogen, alkyl, substituted alkyl, cycloalkyl, substituted cycloalkyl, aryl or substituted aryl.

"Heteroaryl" by itself or as part of another substituent, refers to a monovalent heteroaromatic radical derived by the removal of one hydrogen atom from a single atom of a parent heteroaromatic ring system. Typical heteroaryl groups include, but are not limited to, groups derived from acridine, arsindole, carbazole, β-carboline, benzoxazine, benzimidazole, chromane, chromene, cinnoline, furan, imidazole, indazole, indole, indoline, indolizine, isobenzofuran, isochromene, isoindole, isoindoline, isoquinoline, isothiazole, isoxazole, naphthyridine, oxadiazole, oxazole, perimidine, phenanthridine, phenanthroline, phenazine, phthalazine, pteridine, purine, pyran, pyrazine, pyrazole, pyridazine, pyridine, pyrimidine, pyrrole, pyrrolizine, quinazoline, quinoline, quinolizine, quinoxaline, tetrazole, thiadiazole, thiazole, thiophene, triazole, xanthene, and the like. Preferably, the heteroaryl group is from 5-20 membered heteroaryl, more preferably from 5-10 membered heteroaryl. Preferred heteroaryl groups are those derived from thiophene, pyrrole, benzothiophene, benzofuran, indole, pyridine, quinoline, imidazole, oxazole and pyrazine.

"Heteroarylalkyl" by itself or as part of another substituent refers to an acyclic alkyl group in which one of the hydrogen atoms bonded to a carbon atom, typically a terminal or $sp^3$ carbon atom, is replaced with a heteroaryl group. Where specific alkyl moieties are intended, the nomenclature heteroarylalkanyl, heteroarylalkenyl and/or heteroarylalkynyl is used. In preferred embodiments, the heteroarylalkyl group is a 6-21 membered heteroarylalkyl, e.g., the alkanyl, alkenyl or alkynyl moiety of the heteroarylalkyl is (C1-C6)alkyl and the heteroaryl moiety is a 5-15-membered heteroaryl. In particularly preferred embodiments, the heteroarylalkyl is a 6-13 membered heteroarylalkyl, e.g., the alkanyl, alkenyl or alkynyl moiety is (C1-C3)alkyl and the heteroaryl moiety is a 5-10 membered heteroaryl.

"Hydroxyalkyl" by itself or as part of another substituent refers to an alkyl group in which one or more of the hydrogen atoms are replaced with a hydroxyl substituent. Thus, the term "hydroxyalkyl" is meant to include monohydroxyalkyls, dihydroxyalkyls, trihydroxyalkyls, etc.

"Parent Aromatic Ring System" refers to an unsaturated cyclic or polycyclic ring system having a conjugated π electron system. Specifically included within the definition of "parent aromatic ring system" are fused ring systems in which one or more of the rings are aromatic and one or more of the rings are saturated or unsaturated, such as, for example, fluorene, indane, indene, phenalene, tetrahydronaphthalene, etc. Typical parent aromatic ring systems include, but are not limited to, aceanthrylene, acenaphthylene, acephenanthrylene, anthracene, azulene, benzene, chrysene, coronene, fluoranthene, fluorene, hexacene, hexaphene, hexylene, indacene, s-indacene, indane, indene, naphthalene, octacene, octaphene, octalene, ovalene, penta-2,4-diene, pentacene, pentalene, pentaphene, perylene, phenalene, phenanthrene, picene, pleiadene, pyrene, pyranthrene, rubicene, tetrahydronaphthalene, triphenylene, trinaphthalene, and the like, as well as the various hydro isomers thereof.

"Parent Heteroaromatic Ring System" refers to a parent aromatic ring system in which one or more carbon atoms (and any associated hydrogen atoms) are independently replaced with the same or different heteroatom. Typical heteroatoms to replace the carbon atoms include, but are not limited to, N, P, O, S, Si, etc. Specifically included within the definition of "parent heteroaromatic ring systems" are fused ring systems in which one or more of the rings are aromatic and one or more of the rings are saturated or unsaturated, such as, for example, arsindole, benzodioxan, benzofuran, chromane, chromene, indole, indoline, xanthene, etc. Typical parent heteroaromatic ring systems include, but are not limited to, arsindole, carbazole, β-carboline, chromane, chromene, cinnoline, furan, imidazole, indazole, indole, indoline, indolizine, isobenzofuran, isochromene, isoindole, isoindoline, isoquinoline, isothiazole, isoxazole, naphthyridine, oxadiazole, oxazole, perimidine, phenanthridine, phenanthroline, phenazine, phthalazine, pteridine, purine, pyran, pyrazine, pyrazole, pyridazine, pyridine, pyrimidine, pyrrole, pyrrolizine, quinazoline, quinoline, quinolizine, quinoxaline, tetrazole, thiadiazole, thiazole, thiophene, triazole, xanthene, and the like.

"Leaving group" is a group that is displaced during a reaction by a nucleophilic reagent. Suitable leaving groups include $S(O)_2Me$, —SMe or halo (e.g., F, Cl, Br, I).

"Linking group" is a group that serves as an intermediate locus between two or more end groups. The nature of the linking group can vary widely, and can include virtually any combination of atoms or groups useful for spacing one molecular moiety from another. For example, the linker may be an acyclic hydrocarbon bridge (e.g, a saturated or unsaturated alkyleno such as methano, ethano, etheno, propano, prop[1]eno, butano, but[1]eno, but[2]eno, buta[1,3]dieno, and the like), a monocyclic or polycyclic hydrocarbon bridge (e.g., [1,2]benzeno, [2,3]naphthaleno, and the like), a simple acyclic heteroatomic or heteroalkyldiyl bridge (e.g., —O—, —S—, —S—O—, —NH—, —PH—, —C(O)—, —C(O)NH—, —S(O)—, $—S(O)_2—$, —S(O)NH—, $—S(O)_2NH—$, $—O—CH_2—$, $—CH_2—O—CH_2—$, $—O—CH=CH—CH_2—$, and the like), a monocyclic or polycyclic heteroaryl bridge (e.g., [3,4]furano, pyridino, thiopheno, piperidino, piperazino, pyrazidino, pyrrolidino, and the like) or combinations of such bridges.

"Protecting group" is a group that is appended to, for example, a hydroxyloxygen in place of a labile hydrogen atom. Suitable hydroxyl protecting group(s) include esters (acetate, ethylacetate), ethers (methyl, ethyl), ethoxylated derivatives (ethylene glycol, propylene glycol) and the like that can be removed under either acidic or basic conditions so that the protecting group is removed and replaced with a hydrogen atom. Guidance for selecting appropriate protecting groups, as well as synthetic strategies for their attachment and removal, may be found, for example, in Greene & Wuts, *Protective Groups in Organic Synthesis,* 3d Edition, John Wiley & Sons, Inc., New York (1999) and the references cited therein (hereinafter "Greene & Wuts").

It should be understood that the compositions of the invention (the combination of the crosslinker and initiator) can be combined immediately prior to use. Alternatively, the components can be prepared separately, for example as solutions, and then combined prior to use. In yet another aspect, the components can be prepared and placed in separate containers, thus providing a two component kit. Alternatively, the components can be mixed and stored in a single container suitable for use.

The crosslinker and initiator are soluble in most common solvents including chloroform, methylene chloride, acetone, ethyl acetate, isopropanol, etc. In an embodiment, the crosslinker and initiator are soluble in acetone. In another embodiment, the crosslinker and initiator are soluble in isopropanol. The use of isopropanol as a solvent limits evaporation and is environmentally friendly. The use of the combination of the crosslinker and initiator is economically very efficient as relatively little crosslinker is used relative to the initiator in the formation of the primer on a surface.

The compositions of the invention can be used as coating agents.

The compositions of the invention can be applied to a surface of interest in any suitable manner. For example, the composition can be applied by dip coating or by dispersing the compound on the surface (for example, by spray coating). Suitable methods of application include application in solution, dipping, spray coating, knife coating, and roller coating. In one aspect, the composition is applied to the surface via spray coating, as this application method provides increased density of the coating on the support surface, thereby improving durability.

Plastics such as polyolefins, polystyrenes, poly(methyl) methacrylates, polyacrylonitriles, poly(vinylacetates), poly (vinyl alcohols), chlorine-containing polymers such as poly (vinyl)chloride, polyoxymethylenes, polycarbonates, polyamides, polyimides, polyurethanes, phenolics, amino-epoxy resins, polyesters, silicones, cellulose-based plastics, and rubber-like plastics can all be used as supports, providing surfaces that can be modified as described herein. See generally, "Plastics", pp. 462-464, in Concise Encyclopedia of Polymer Science and Engineering, Kroschwitz, ed., John Wiley and Sons, 1990, the disclosure of which is incorporated herein by reference. In addition, supports such as those formed of pyrolytic carbon, parylene coated surfaces, and silylated surfaces of glass, ceramic, natural polymers, such as wood (cellulose), polysaccharides, proteins, paper, ceramics, metals or composites are suitable for surface modification.

Once the composition is applied to a substrate, the coating is then subjected to an energy source suitable to initiate reaction of the initiator and/or the crosslinker.

Not to be limited by theory, the coatings of the invention adhere to the surface of the substrate. It is unknown whether the adhesion is from covalent or ionic attachment, or if any physical attachment actually occurs. However, it has been found that treatment of the coatings where inter- or intrapolymeric crosslinking is accomplished (such as thermal, photoactivation (photopolymerization), radical generation, etc.) often provides a durable coating that is not easily removed.

Photoactivation can be defined as a phenomenon whereby individual substances are joined together to create a new larger structure by way of the action of light. When light is absorbed, electrons populate excited states in molecules. These excited states are generally quite short-lived and terminate by one of three pathways. The excited state can emit a photon from either a singlet state (fluorescence) or a triplet state (phosphorescence), lose its energy via vibrations in the form on heat, or react chemically. Because the absorption of a photon highly excites a molecule, there is a much wider variety of reactions possible than standard thermochemical means. Photocrosslinking uses these reactions to join small to molecules to other small molecules, large molecules to small molecules, and large molecules to each other (photocoupling of polymers), as well as large and small molecules to substrates or particles (photobonding to surfaces). During photocrosslinking each increase in molecular weight is initiated by its own photochemical reaction and the coupling of radicals can result in the formation of crosslinks, especially in the solid state. Photocrosslinking can usually be classified into two types.

The first type is where crosslinks are formed by the direct reaction of an excited molecule. Representative reactions would be a photo 2+2 cycloaddition (or 4+4) and cis-trans isomerization of double bonds. Examples of this type are demonstrated by the cyclodimerization of cinnamic acid and derivatives, chalcones and stilbenes, anthracenes, maleimides and strained cycloalkenes. In another large class of reactions, the triplet, $T_1$ excited state of carbonyl groups in ketones can result in either fragmentation (Norrish Type I reaction) or hydrogen abstraction (Norrish type II reaction). Both of these photoreactions create two radicals which can then subsequently react with surrounding molecules. For example, aromatic ketones, such as benzophenone, readily undergo hydrogen abstraction reactions with any preformed polymer possessing C—H bonds. A possible mechanism is shown in the Scheme which follows.

$(C_6H_5)_2C=O)(T_1)+Rp-H \rightarrow (C_6H_5)_2C.—OH)+Rp.$ $Rp.+(C_6H_5)_2C.—OH) \rightarrow (C_6H_5)_2C-(Rp)-OH)$ $Rp.+Rp. \rightarrow Rp-Rp$ The second usual type of photocrosslinking is where crosslinks occur through the action of a photogenerated reactive species. Examples of the second type include the use of nitrenes that are formed from organic azides and carbenes.

Whether through direct excited state reaction or reactive intermediates, photolysis of photoreactive groups can begin a process of bond formation throughout a mixture. The act of cross linking will serve to increase the durability of this surface. Bonds will be formed between initiators and crosslinkers, crosslinkers and crosslinkers, initiators and initiators, and between crosslinkers and/or initiators and the surface of the substrate. Bond formation may take place by many means within the various systems. In many cases radicals are formed through photolysis. Radicals can form new bonds through radical-radical recombination, addition to unsaturated bonds, hydrogen abstraction and subsequent recombination or addition, further fragmentation, oxygen addition, or disproportionation, as well as possible electron transfer reactions. Similarly, photoreactive polymeric species can be bonded to the surface of the substrate. All of these newly formed covalent bonds increase the durability and stability of the matrix. In cases which generate carbenes and nitrenes, bonds would be formed typically by insertion, hydrogen abstraction to form radicals, rearrangements, etc. This invention is not limited to these mechanisms, and in fact, many mechanisms may be at work within one photoactivatable crosslinker(s) and initiator(s) system.

Photoreactive species are as described herein, and are sufficiently stable to be stored under conditions in which they retain such properties. See, e.g., U.S. Pat. No. 5,002,582, the disclosure of which is incorporated herein by reference. Latent reactive groups can be chosen that are responsive to various portions of the electromagnetic spectrum, with those responsive to ultraviolet, infrared and visible portions of the spectrum (referred to herein as "photoreactive").

Photoreactive groups respond to external stimuli and undergo active specie generation with the formation of a covalent bond to an adjacent chemical structure, e.g., as provided by the same or a different molecule. Photoreactive groups are those groups of atoms in a molecule that retain their covalent bonds during storage but, upon activation by an external energy source, form covalent bonds with other molecules.

Photoreactive groups generate active species such as free radicals and particularly nitrenes, carbenes, and excited states of ketones upon absorption of electromagnetic energy. Photoreactive groups can be chosen to be responsive to various portions of the electromagnetic spectrum, and photoreactive species that are responsive to electromagnetic radiation, including, but not limited to ultraviolet, infrared and visible portions of the spectrum, are referred to as a "photochemical group" or "photogroup."

The initiators that can be combined with the crosslinkers described herein to form the inventive compositions of the invention include photoreactive initiators as well as thermal initiators.

Free radical initiators can be classified by the following two types.

Type A. Compounds directly produce radicals by unimolecular fragmentation after light absorption. The radicals result from a homolytic or heterolytic cleavage of a sigma bond inside the molecule itself. Common examples include but are not limited to peroxides, and peroxy compounds, benzoin derivatives (including ketoxime esters of benzoin), acetophenone derivatives, benzilketals, α-hydroxyalkylphenones and α-aminoalkylphenones, O-acyl α-oximinoketones, acylphosphine oxides and acylphosphonates, thiobenzoic S-esters, azo and azide compounds, triazines and biimidazoles.

Type B. Compounds generate free radicals by bimolecular hydrogen abstraction after light absorption. The hydrogen abstraction photoreactive group enters an excited state and undergo an intermolecular reaction with a hydrogen donor to generate free radicals. This leads to the formation of a pair of radicals originating from two different molecules. The coupling of radicals can be used to form crosslinks, especially in the solid state in the absence of solvents. Common examples include but are not limited to the following chemical classes. Quinones, benzophenones, xanthones and thioxanthones, ketocoumarins, aromatic 1,2 diketones and phenylglyoxylates. Hydrogen abstraction reactions can also occur intramolecularly. The reactions are not effective for the direct initiation of polymerization and are used internally for the formation of an intermediate. This intermediate may be effective for further cross linking depending on its structure.

The photolysis of organic azides has been shown to result in $N_2$ loss, producing nitrenes as reactive intermediates. Nitrenes are known to undergo five general reactions. 1) Addition to double bonds is observed for both singlet and triplet nitrenes which in the case of arylnitrenes results in rearrangement of the aziridine to a secondary amine as a conceivable mechanism. 2) Insertion of a nitrene into a carbon-hydrogen bond to give a secondary amine which is observed for singlet nitrenes. 3) Hydrogen abstraction is the most common reaction of triplet nitrenes in solution where the formed amino radical and carbon radical generally diffuse apart and the amino radical abstracts a second hydrogen atom to give a primary amine. 4) Nitrene dimerization 5) Attack on heteroatom, for example nitrenes react with azides and oxygen.

Upon direct excitation, carbon halogen bonds such as those in trichloromethyl triazine, tribromomethyl triazine, and aryl iodides, homolytically cleave forming a halogen radical and a carbon radical. Either or both radicals can then abstract hydrogen, disproportionate, couple other radicals, add to unsaturated bonds, or perform other typical radical reactions resulting in crosslinking and bond formation. Suitable examples include trichloromethyl triazines, tribromomethyl triazines and/or aryl iodides.

The use of photoreactive groups in the form of photoreactive aryl ketones are useful such as acetophenone, benzophenone, anthraquinone, anthrone, and anthrone-like heterocycles (i.e., heterocyclic analogs of anthrone such as those having N, O, or S in the 10-position), or their substituted (e.g., ring substituted) derivatives. Examples of aryl ketones include heterocyclic derivatives of anthrone, including acridone, xanthone, and thioxanthone, and their ring substituted derivatives. In particular, thioxanthone, and its derivatives, having excitation wavelengths greater than about 360 nm are useful.

The photoreactive groups of such ketones are preferred since they are readily capable of undergoing an activation/inactivation/reactivation cycle. Benzophenone, acetophenone and anthraquinone are examples of photoreactive moieties, since they are capable of photochemical excitation with the initial formation of an excited singlet state that undergoes intersystem crossing to the triplet state. The excited triplet state can insert into carbon-hydrogen bonds by abstraction of a hydrogen atom (from a support surface, for example), thus creating a radical pair. Subsequent collapse of the radical pair leads to formation of a new carbon-carbon bond. If a reactive bond (e.g., carbon-hydrogen) is not available for bonding, the ultraviolet light-induced excitation of the benzophenone, acetophenone or anthraquinone group is reversible and the molecule returns to ground state energy level upon removal of the energy source. Photoactivatible aryl ketones such as benzophenone, anthraquinone and acetophenone are of particular importance inasmuch as these groups are subject to multiple reactivation in water and hence provide increased coating efficiency.

Another class of photoreactive groups includes compounds having an Si—Si bond, wherein it is believed the Si—Si bond is broken upon excitation with a light source, such as with a laser or UV light. The radicals generated upon the bond breakage provide for reactive sites suitable for use with the present invention. (For examples of Si—Si bond cleavage, see J. Lalevee, M. El-Roz, F. Morlet-Savery, B. Graff, X. Allonas and J. P. Fouassier, "New Highly efficient Radical Photoinitiators based on Si—Si Cleavage" Macromolecules, 2007, 40, 8527-8530 which describes 10,10'-bis (10-phenyl-10H-phenoxasilin (Sigma-Aldrich, St. Louis Mo.) and 9,9'-dimethyl-9,9'-bis-(9H-9-silafluorene, the contents of which are incorporated herein in their entirety.)

Thermal polymerization can be defined as a phenomenon whereby individual substances are joined together to create larger structures by the action of heat. Numerous substances decompose to free radicals when heated. If the decomposition temperature corresponds to a convenient temperature range the substance may be useful in reactions to join small molecules to other small molecules, large molecules to small molecules and large molecules to each other (thermal coupling of polymers), as well as large and small molecules to substrates or particles (thermal bonding to surfaces). Useful thermal initiators include organic peroxides, redox reagents, organic hydroperoxides, azo compounds, metal alkyls and organometallic reagents.

Dialkyl, diacyl and hydrogen peroxides decompose thermally by cleavage of the oxygen bond to yield two alkoxy radicals. Azo compounds decompose thermally to give nitrogen and two alkyl radicals. The radicals may then initiate reactions as described in photopolymerization free radical reactions.

Medical articles that can be fabricated from or coated or treated with the compositions of the invention include, but are not limited to, catheters including urinary catheters and vascular catheters (e.g., peripheral and central vascular catheters), wound drainage tubes, arterial grafts, soft tissue patches, gloves, shunts, stents, tracheal catheters, wound dressings, sutures, guide wires and prosthetic devices (e.g., heart valves and LVADs). Vascular catheters which can be prepared according to the present invention include, but are not limited to, single and multiple lumen central venous catheters, peripherally inserted central venous catheters, emergency infusion catheters, percutaneous sheath introducer systems, thermodilution catheters, including the hubs and ports of such vascular catheters, leads to electronic devices such as pacemakers, defibrillators, artificial hearts, and implanted biosensors.

Crosslinkers encompassed by the present invention can be prepared by a variety of methods. Generally, the core molecule has functionalities that can react with or be converted into more than one aryl ketone, azide, diazo or trichloromethyl triazine moieties. This can be accomplished by nucleophilic displacement of a suitable leaving group on either the core molecule or the photoactivatable agent. For example, hydroxyl groups of the core molecule can be converted into a suitable leaving group such as a halide and subjected to nucleophilic displacement by sodium azide. Similarly, a halogenated site can be converted into an amine that is then suitable for conversion to a diazo moiety. Carbene generation can be accomplished by uv irradiation of diazo and azide compounds. Trichloromethyl triazine moiety can be incorporated into a core molecule by first preparing the acyl chloride of 4-(4-carboxyphenyl)-2,6-bis (trichloromethyl)-s-triazine with thionyl chloride followed by reaction with a suitable nucleophilic agent on the core molecule.

Aryl ketone containing crosslinkers encompassed by the present invention can be prepared by selection of an appropriate aryl group with a photoactivatable group and at least one group that can either act as a nucleophilic site or can be acted upon in a nucleophilic displacement reaction with a linking agent (L) having at least two opposing groups, either a leaving group(s) or a nucleophilic group(s). General synthetic schemes detailed below demonstrate two approaches suitable to prepare compounds of the invention.

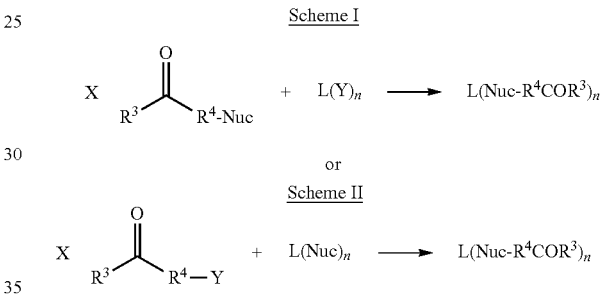

wherein X is an integer equivalent to "n" and n is an integer between 2 and about 6, $R^3$ and $R^4$ are as defined above, "Y" is a leaving group or a group that can be acted upon by a nucleophilic group, such as an ester, carboxylic acid halide, etc. and "Nuc" is a nucleophilic group, as described in further detail below. Alternatively, the reaction between "Y" and "Nuc" can be a condensation reaction, such as the reaction between, for example, a hydroxyl group and a carboxylic acid.

It should be understood in schemes I and II, that $R^3$ and $R^4$ are interchangeable.

Suitable nucleophilic groups (Nuc) include, for example, amines, hydroxyl, thiol, etc.

Suitable leaving groups, or groups susceptible to nucleophilic attack, include esters, ethers, epoxides, halides, isocyanates, isothiocyanates, sulfonyl chlorides, anhydrides, carboxylic acid halides, carboxylic acid esters, and aldehydes.

Resultant functional moieties from the reaction between the nucleophilic group and leaving (or condensation group) include, for example, esters, ethers, carbamates, thiocarbamates, sulfones, amides, ureas, thiourea, amines, sulfonamides, imines (that can be further reduced with a reducing agent such as sodium borohydride to an amine), etc.

Suitable reaction conditions for such condensations or nucleophilic displacements are known in the art. For example, hydroxyl containing moieties can be condensed with a carboxylic acid under dehydrating conditions (refluxing toluene, acid catalyst, Dean Stark trap) to form esters. Reactive halides can be displaced by hydroxyl groups under basic conditions. An isocyanate reacts with a hydroxyl group with heat to form carbamates. Likewise, an isothiocyanates reacts with a hydroxyl group to form a thiocarbamate. Under deprotonation conditions, a hydroxide ion reacts with an epoxide to form an ether linkage and forming a new hydroxyl group. Reaction between a hydroxyl and a sulfonyl chloride forms a sulfone. Reaction between a hydroxyl and an anhydride will form a ester with a carboxylic acid portion as well. Reaction between a hydroxyl group and an ester will also form an ester, with the removal of a corresponding displaced alcohol, generally under conditions that drive off the displaced alcohol.

Much like the reactions with hydroxyl groups, amines serve in similar manner. For example, an amine can react with an activated carboxylic acid for form an amide. Activation of a carboxylic acid can be facilitated by various methods in the art, including for example, use of dicyclohexylcarbodiimide (DCC) that generates urea as a side product. An isocyanate reacts with an amine to form a urea and an isothiocyanate reacts with an amine to form a thiourea.

ties of the crosslinkers can be greater than 80%, in particular greater than 90%, more particularly greater than 95% and most particularly greater than 99%, e.g., 99.5% or greater.

It should also be understood that where mixtures of products (mono, di, tri-substituted, etc.) can be formed during the synthetic process, that the mixture can be separated and purified to afford a crosslinker that has the purities noted above. Selection of appropriate reaction conditions can provide a product that includes a majority of fully substituted and desired crosslinking material.

It should also be understood that each "Y" independently can be different. Therefore, it is possible to have reaction products that include an ether linkage as well as an ester linkage to the carbonyl containing photoactivatable group.

An exemplary non-limiting reaction is depicted in Scheme III, in which a hydroxyl group undergoes nucleophilic addition to an ester or acid halide or can undergo a condensation reaction between the hydroxyl group and a carboxylic acid.

Scheme III

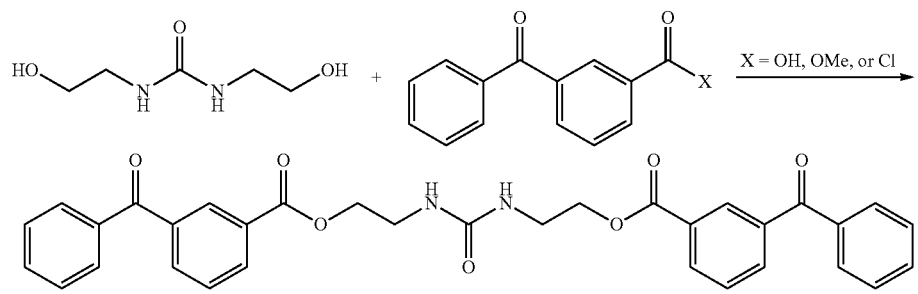

Reaction between an amine and an epoxide will form an amine with an appended hydroxyl group from the nucleophilic displacement of the epoxide ring. Reaction between an amine and a sulfonyl chloride will form a sulfonamide. Reaction between an anhydride and an amine will afford an amide with a carboxylic portion attached to the product. Reaction between an aldehyde and an amine will form an imine which can be further reduced to an amine. Reaction between a carboxylic acid halide and an amine will form an amide, as well as the reaction between a carboxylic ester and amine. Lastly, melamine type compounds can react with an amine to form amine linkages.

Reaction conditions to form the compounds of the invention are known in the art. For example, suitable reaction conditions are described in "March's Advanced Organic Chemistry: Reactions, Mechanisms, and Structure, 5th Edition, John Wiley & Sons, Michael B. Smith & Jerry March; Fieser and Fieser's Reagents for Organic Synthesis" John Wiley & Sons, NY; Vogel's Textbook of Practical Organic Chemistry (Fifth Edition) by A. I. Vogel, B. S. Furniss, A. J. Hannaford, P. W. G. Smith, and A. R. Tatchell, Longman Scientific and Technical, Longman Group UK; and Advanced Organic Chemistry parts A and B" Third Edition, F. A. Carey, R. S. Sundberg, Plenum Press, NY, 1990, the contents of which are incorporated herein by reference in their entirety.

It should be understood that the reaction products of the crosslinkers can be isolated an purified by suitable methods known in the art. These include, but are not limited to, crystallization, distillation, chromatography, etc. and puri- The following paragraphs enumerated consecutively from 1 through 87 provide for various aspects of the present invention. In one embodiment, in a first paragraph (1), the present invention provides a composition comprising a formula:

wherein L is a linking group;

D is O, S, SO, $SO_2$, $NR^5$ or $CR^6R^7$;

T is $(-CH_2-)_x$, $(-CH_2CH_2-O-)_x$, $(-CH_2CH_2CH_2-O-)_x$, $(-CH_2CH_2CH_2CH_2-O-)_x$ or forms a bond;

$R^1$ is a hydrogen atom, an alkyl, alkyloxyalkyl, aryl, aryloxyalkyl or aryloxyaryl group;

X is O, S, or $NR^8R^9$;

P is a hydrogen atom or a protecting group, with the provisio that P is absent when X is $NR^8R^9$;

$R^2$ is a hydrogen atom, an alkyl, alkyloxyalkyl, aryl, aryloxyalkyl or aryloxyaryl group;

G is O, S, SO, $SO_2$, $NR^{10}$, $(CH_2)_r$—O— or C=O;

$R^3$ and $R^4$ are each independently an alkyl, aryl, arylalkyl, heteroaryl, or an heteroarylalkyl group or optionally, $R^3$ and $R^4$ can be tethered together via $(-CH_2-)_q$, $(-CH_2-)_r$ $C=O(-CH_2-)_s$, $(-CH_2-)_rS(-CH_2-)_s$, $(-CH_2-)_r$ $S=O(-CH_2-)_s$ or $(-CH_2-)_rS(O)_2(-CH_2-)_s$, $(-CH_2-)_rNR(-CH_2-)_s$;

$R^5$ and $R^{10}$ are each independently a hydrogen atom or an alkyl, aryl or arylalkyl group;

$R^6$ and $R^7$ are each independently a hydrogen atom, an alkyl, aryl, arylalkyl, heteroaryl or heteroarylalkyl group;

$R^8$ and $R^9$ are each independently a hydrogen atom, an alkyl, aryl, or arylalkyl group;

R is a hydrogen atom, an alkyl or an aryl group;

q is an integer from 1 to about 7;

r is an integer from 0 to about 3;

s is an integer from 0 to about 3;

m is an integer from 2 to about 10;

t is an integer from 1 to about 10;

x is an integer from 1 to about 500; and an initiator.

2. The composition according to paragraph 1, wherein L is a branched or unbranched alkyl chain having between about 2 and about 10 carbon atoms.

3. The composition according to paragraph 2, wherein D is O.

4. The composition according to paragraph 3, wherein T is $(-CH_2-)_x$ or $(-CH_2CH_2-O-)_x$ and x is 1 or 2.

5. The composition according to paragraph 4, wherein $R^1$ is a hydrogen atom.

6. The composition according to paragraph 5, wherein X is O and P is a hydrogen atom.

7. The composition according to paragraph 6, wherein $R^2$ is a hydrogen atom.

8. The composition according to claim 7, wherein G is O.

9. The composition according to paragraph 8, wherein $R^3$ and $R^4$ are each individually aryl groups.

10. The composition according to paragraph 9, wherein m is 3.

11. The composition according to paragraph 1, wherein L is

D is O, T is $(-CH_2-)_x$, $R^1$ is a hydrogen atom, X is O, P is a hydrogen atom, $R^2$ is a hydrogen atom, G is O, $R^3$ and $R^4$ are phenyl groups, m is 3 and x is 1.

12. The composition according to paragraph 1, wherein L is $(-CH_2-)_y$, D is O, T is $(-CH_2-)_x$, $R^1$ is a hydrogen atom, X is O, P is a hydrogen atom, $R^2$ is a hydrogen atom, G is O, $R^3$ and $R^4$ are phenyl groups, m is 2, x is 1 and y is an integer from 2 to about 6.

13. The composition according to paragraph 12, wherein y is 2, 4 or 6.

14. A composition comprising a formula:

L-((T-C($R^1$)(XP)CHR$^2$GR$^3$C(=O)R$^4$))$_m$ wherein L is a linking group;

T is $(-CH_2-)_x$, $(-CH_2CH_2-O-)_x$, $(-CH_2CH_2CH_2-O-)_x$, $(-CH_2CH_2CH_2CH_2-O-)_x$ or forms a bond;

$R^1$ is a hydrogen atom, an alkyl, alkyloxyalkyl, aryl, aryloxyalkyl or aryloxyaryl group;

X is O, S, or NR$^8$R$^9$;

P is a hydrogen atom or a protecting group, with the proviso that P is absent when X is NR$^8$R$^9$;

$R^2$ is a hydrogen atom, an alkyl, alkyloxyalkyl, aryl, aryloxyalkyl or aryloxyaryl group;

G is O, S, SO, SO$_2$, NR$^{10}$, (CH$_2$)$_t$—O— or C=O;

$R^3$ and $R^4$ are each independently an alkyl, aryl, arylalkyl, heteroaryl, or an heteroarylalkyl group, or optionally, $R^3$ and $R^4$ can be tethered together via $(-CH_2-)_q$, $(-CH_2-)_r$C=O$(-CH_2-)_s$, $(-CH_2-)_rS(-CH_2-)_s$, $(-CH_2-)_rS=O(-CH_2-)_s$ or $(-CH_2-)_rS(O)_2(-CH_2-)_s$, $(-CH_2-)_rNR(-CH_2-)_s$;

$R^{10}$ is a hydrogen atom or an alkyl, aryl or arylalkyl group;

$R^8$ and $R^9$ are each independently a hydrogen atom, an alkyl, aryl, or arylalkyl group;

R is a hydrogen atom, an alkyl or aryl group;

q is an integer from 1 to about 7;

r is an integer from 0 to about 3;

s is an integer from 0 to about 3;

m is an integer from 2 to about 10;

t is an integer from 1 to about 10;

x is an integer from 1 to about 500; and an initiator.

15. The composition of paragraph 14, wherein L has a formula according to structure (I):

(I)

wherein A and J are each independently a hydrogen atom, an alkyl group, an aryl group, or together with B form a cyclic ring, provided when A and J are each independently a hydrogen atom, an alkyl group, or an aryl group then B is not present;

B is NR$^{11}$, O, or $(-CH_2-)_z$;

provided when A, B and J form a ring, then A and J are $(-CH_2-)_z$ or C=O;

$R^{11}$ is a hydrogen atom, an alkyl group, an aryl group or denotes a bond with T;

each z independently is an integer from 0 to 3; and provided when either A or J is C=O, then B is NR$^{11}$, O, or $(-CH_2-)_z$ and z must be at least 1.

16. The composition of paragraph 15, wherein T is —CH$_2$—.

17. The composition of paragraph 16, wherein $R^1$ is a hydrogen atom.

18. The composition according to paragraph 17, wherein X is O and

P is a hydrogen atom.

19. The composition according to paragraph 18, wherein $R^2$ is a hydrogen atom.

20. The composition according to claim 19, wherein G is O.

21. The composition according to paragraph 19, wherein $R^3$ and $R^4$ are each individually aryl groups.

22. The composition according to paragraph 21, wherein m is 3.

23. The composition according to paragraph 22, wherein A and J are both C=O and B is N.

24. The composition according to paragraph 22, wherein A and J are both hydrogen atoms.

25. A composition comprising a formula:

L-((GTZR$^3$C(=O)R$^4$))$_m$ wherein L is a linking group;

T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond;

G is O, S, SO, SO$_2$, NR$^{10}$, (CH$_2$)$_t$—O— or C=O;

Z is C=O, COO, or CONH when T is (—CH$_2$—)$_x$;

R$^3$ and R$^4$ are each independently an alkyl, aryl, arylalkyl, heteroaryl, or an heteroarylalkyl group, or optionally, R$^3$ and R$^4$ can be tethered together via (—CH$_2$—)$_q$, (—CH$_2$—)$_r$C=O(—CH$_2$—)$_s$, (—CH$_2$—)$_t$S(—CH$_2$—)$_s$, (—CH$_2$—)$_r$S=O(—CH$_2$—)$_s$ or (—CH$_2$—)$_r$S(O)$_2$(—CH$_2$—)$_s$, (—CH$_2$—)$_r$NR(—CH$_2$—)$_s$;

R$^{10}$ is a hydrogen atom or an alkyl, aryl, or an arylalkyl group;

R is a hydrogen atom or an alkyl or aryl group;

q is an integer from 1 to about 7;

r is an integer from 0 to about 3;

s is an integer from 0 to about 3;

m is an integer from 2 to about 10;

t is an integer from 1 to about 10;

x is an integer from 1 to about 500; and an initiator.

26. The composition of paragraph 25, wherein L has a formula according to structure (I):

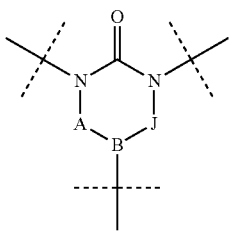

wherein A and J are each independently a hydrogen atom, an alkyl group, an aryl group, or together with B form a cyclic ring, provided when A and J are each independently a hydrogen atom, an alkyl group, or an aryl group then B is not present;

B is NR$^{11}$, O, or (—CH$_2$—)$_z$;

provided when A, B and J form a ring, then A and J are (—CH$_2$—)$_z$ or C=O;

R$^{11}$ is a hydrogen atom, an alkyl group, an aryl group or denotes a bond with T; each z independently is an integer from 0 to 3; and provided when either A or J is C=O, then B is NR$^{11}$, O, or (—CH$_2$—)$_z$ and z must be at least 1.

27. The composition of paragraph 26, wherein T is —CH$_2$—.

28. The composition according to claim 27, wherein G is O.

29. The composition according to paragraph 28, wherein R$^3$ and R$^4$ are each individually aryl groups.

30. The composition according to paragraph 29, wherein m is 2.

31. The composition according to paragraph 30, wherein A and J are both C=O and B is NR$^{11}$.

The composition according to paragraph 30, wherein A and J are both hydrogen atoms.

33. The composition of paragraph 25, wherein L has a formula according to structure (II)

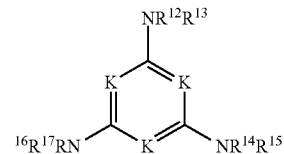

wherein R$^{12}$, R$^{13}$, R$^{14}$, R$^{15}$, R$^{16}$, R$^{17}$ are each independently a hydrogen atom, an alkyl or aryl group or denotes a bond with T, provided at least two of R$^{12}$, R$^{13}$, R$^{14}$, R$^{15}$, R$^{16}$, R$^{17}$ are bonded with T and each K, independently, is CH or N.

34. The composition of paragraph 25, wherein L is C=O.

35. The composition of paragraph 34, wherein G is NH.

36. The composition of paragraph 35, wherein T is —CH$_2$CH$_2$O—.

37. The composition of paragraph 36, wherein Z is C=O.

38. The composition of paragraph 37 where R$^3$ is an aryl group.

39. The composition of paragraph 37, wherein R$^4$ is an aryl group.

40. A composition comprising a formula:

L-((TGQR$^3$C(=O)R$^4$))$_m$ wherein L is a linking group;

T is (—CH$_2$—)$_x$, (—CH$_2$CH$_2$—O—)$_x$, (—CH$_2$CH$_2$CH$_2$—O—)$_x$, (—CH$_2$CH$_2$CH$_2$CH$_2$—O—)$_x$ or forms a bond;

G is O, S, SO, SO$_2$, NR$^{10}$, (CH$_2$)$_t$—O— or C=O;

Q is (—CH$_2$—)$_p$, (—CH$_2$CH$_2$—O—)$_p$, (—CH$_2$CH$_2$CH$_2$—O—)$_p$ or (—CH$_2$CH$_2$CH$_2$CH$_2$—O—)$_p$;

R$^3$ and R$^4$ are each independently an alkyl, aryl, arylalkyl, heteroaryl, or an heteroarylalkyl group, or optionally, R$^3$ and R$^4$ can be tethered together via (—CH$_2$—)$_q$, (—CH$_2$—)$_r$C=O(—CH$_2$—)$_s$, (—CH$_2$—)$_r$S(—CH$_2$—)$_s$, (—CH$_2$—)$_r$S=O(—CH$_2$—)$_s$ or (—CH$_2$—)$_r$S(O)$_2$(—CH$_2$—)$_s$, (—CH$_2$—)$_r$NR(—CH$_2$—)$_s$;

R$^{10}$ is a hydrogen atom or an alkyl, aryl, or an arylalkyl group;

R is a hydrogen atom or an alkyl or aryl group;

q is an integer from 1 to about 7;

r is an integer from 0 to about 3;

s is an integer from 0 to about 3;

m is an integer from 2 to about 10;

is an integer from 1 to about 10;

is an integer from 1 to about 10;

x is an integer from 1 to about 500; and an initiator.

41. The composition of paragraph 40, wherein L has a formula according to structure (I):

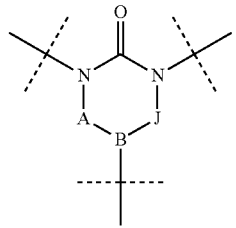

wherein A and J are each independently a hydrogen atom, an alkyl group, an aryl group, or together with B form a cyclic ring, provided when A and J are each independently a hydrogen atom, an alkyl group, or an aryl group then B is not present;

B is $NR^{11}$, O, or $(-CH_2-)_z$;

provided when A, B and J form a ring, then A and J are $(-CH_2-)_z$ or C=O;

$R^{11}$ is a hydrogen atom, an alkyl group, an aryl group or denotes a bond with T;

each z independently is an integer from 0 to 3; and provided when either A or J is C=O, then B is $NR^{11}$, O, or $(-CH_2-)_z$ and z must be at least 1.

42. The composition of paragraph 41, wherein T is $-CH_2-$.

43. The composition according to claim 42, wherein G is O.

44. The composition according to paragraph 43, wherein $R^3$ and $R^4$ are each individually aryl groups.

45. The composition according to paragraph 44, wherein m is 2.

46. The composition according to paragraph 45, wherein A and J are both C=O and B is $NR^{11}$.

47. The composition according to paragraph 45, wherein A and J are both hydrogen atoms.

48. The composition of paragraph 40, wherein L has a formula according to structure (II):

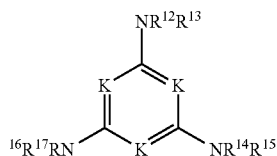

wherein $R^{12}$, $R^{13}$, $R^{14}$, $R^{15}$, $R^{16}$, $R^{17}$ are each independently a hydrogen atom, an alkyl or aryl group or denotes a bond with T, provided at least two of $R^{12}$, $R^{13}$, $R^{14}$, $R^{15}$, $R^{16}$, $R^{17}$ are bonded with T and each K, independently, is CH or N.

49. A composition comprising a formula:

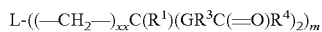

wherein L is a linking group;

$R^1$ is a hydrogen atom, an alkyl, alkyloxyalkyl, aryl, aryloxyalky, or aryloxyaryl group;

each G is O, S, SO, $SO_2$, $NR^{10}$, $(CH_2)_t$—O— or C=O;

each $R^3$ and $R^4$ are each independently an alkyl, aryl, arylalkyl, heteroaryl, or an heteroarylalkyl group, or optionally, $R^3$ and $R^4$ can be tethered together via $(-CH_2-)_q$, $(-CH_2-)_rC=O(-CH_2-)_s$, $(-CH_2-)_rS(-CH_2-)_s$, $(-CH_2-)_rS=O(-CH_2-)_s$ or $(-CH_2-)_rS(O)_2(-CH_2-)_s$, $(-CH_2-)_rNR(-CH_2-)_s$;

each $R^{10}$ is a hydrogen atom or an alkyl, aryl, or an arylalkyl group;

each R is a hydrogen atom or an alkyl or aryl group;

each q is an integer from 1 to about 7;

each r is an integer from 0 to about 3;

each s is an integer from 0 to about 3;

m is an integer from 2 to about 10;

each t is an integer from 1 to about 10;

x is an integer from 1 to about 10; and n initiator.

50. The composition of paragraph 49, wherein L has a formula according to structure (I):

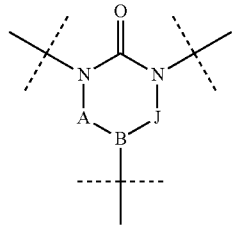

wherein A and J are each independently a hydrogen atom, an alkyl group, an aryl group, or together with B form a cyclic ring, provided when A and J are each independently a hydrogen atom, an alkyl group, or an aryl group then B is not present;

B is $NR^{11}$, O, or $(-CH_2-)_z$;

provided when A, B and J form a ring, then A and J are $(-CH_2-)_z$ or C=O;

$R^{11}$ is a hydrogen atom, an alkyl group, an aryl group or denotes a bond with T;

each z independently is an integer from 0 to 3; and provided when either A or J is C=O, then B is $NR^{11}$, O, or $(-CH_2-)_z$ and z must be at least 1.

51. The composition of paragraph 50, wherein A and B are both hydrogen atoms.

52. The composition of paragraph 49, wherein xx is 1.

53. The composition of paragraph 49, wherein each $R^1$ is H.

54. The composition of paragraph 49, wherein each G is $(-CH_2-)_tO-$ and t is 1.

55. The composition of paragraph 49, wherein each $R^3$ and $R^4$ are each individually aryl groups.

56. The composition of paragraph 51, wherein xx is 1, each G is $(-CH_2-)_tO-$ and t is 1, each $R^1$ is H and each $R^3$ and $R^4$ are each individually aryl groups.

57. A composition comprising a formula:

wherein L is a linking group;

$R^1$ is a hydrogen atom, an alkyl, alkyloxyalkyl, aryl, aryloxyalkyl or aryloxyaryl group;

X is O, S, or $NR^8R^9$;

P is a hydrogen atom or a protecting group, with the provisio that P is absent when X is $NR^8R^9$;

$R^2$ is a hydrogen atom, an alkyl, alkyloxyalkyl, aryl, aryloxyalkyl or aryloxyaryl group;

G is O, S, SO, $SO_2$, $NR^{10}$, $(CH_2)_t$—O— or C=O;

$R^3$ and $R^4$ are each independently an alkyl, aryl, arylalkyl, heteroaryl, or an heteroarylalkyl group, or optionally, $R^3$ and $R^4$ can be tethered together via $(-CH_2-)_q$, $(-CH_2-)_rC=O(-CH_2-)_s$, $(-CH_2-)_rS(-CH_2-)_s$, $(-CH_2-)_rS=O(-CH_2-)_s$ or $(-CH_2-)_rS(O)_2(-CH_2-)_s$, $(-CH_2-)_rNR(-CH_2-)_s$;

$R^8$ and $R^9$ are each independently a hydrogen atom, an alkyl, aryl, or arylalkyl group;

$R^{10}$ is a hydrogen atom or an alkyl, aryl, or an arylalkyl group;

R is a hydrogen atom, an alkyl or an aryl group;

q is an integer from 1 to about 7;

r is an integer from 0 to about 3;

s is an integer from 0 to about 3;

m is an integer from 2 to about 10;

t is an integer from 1 to about 10; and an initiator.

58. The composition of paragraph 57, wherein L is

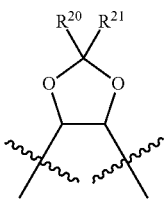

and $R^{20}$ and $R^{21}$ are each individually a hydrogen atom, an alkyl group or an aryl group.

59. The composition of paragraph 57, wherein $R^1$ is H.
60. The composition of paragraph 57, wherein X is O.
61. The composition of paragraph 57, wherein P is H.
62. The composition of paragraph 57, wherein $R^2$ is H.
63. The composition of paragraph 57, wherein G is $(-CH_2-)_tO-$ and t is 1.
64. The composition of paragraph 57, wherein $R^3$ and $R^4$ are each individually aryl groups.
65. The composition of paragraph 58, wherein $R^1$ is H, X is O, P is H, $R^2$ is H, G is $(-CH_2-)_tO-$, t is 1, $R^3$ and $R^4$ are each individually aryl groups and $R^{20}$ and $R^{21}$ are both methyl groups.
66. A composition comprising the formula:

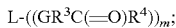

wherein L is a linking group;
G is O, S, SO, $SO_2$, $NR^{10}$, $(CH_2)_t-O-$ or C=O;
$R^3$ and $R^4$ are each independently an alkyl, aryl, arylalkyl, heteroaryl, or an heteroarylalkyl group, or optionally, $R^3$ and $R^4$ can be tethered together via $(-CH_2-)_q$, $(-CH_2-)_r C=O(-CH_2-)_s$, $(-CH_2-)_rS(-CH_2-)_s$, $(-CH_2-)_r S=O(-CH_2-)_s$ or $(-CH_2-)_rS(O)_2(-CH_2-)_s$, $(-CH_2-)_rNR(-CH_2-)_s$;
$R^{10}$ is a hydrogen atom or an alkyl, aryl, or an arylalkyl group;
R is a hydrogen atom, an alkyl or an aryl group;
q is an integer from 1 to about 7;
r is an integer from 0 to about 3;
s is an integer from 0 to about 3;
m is an integer from 2 to about 10;
t is an integer from 1 to about 10; and
an initiator.

67. The composition of paragraph 66, wherein L is

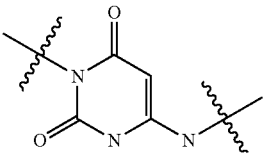

68. The composition of paragraph 66, wherein G is C=O.
69. The composition of paragraph 66, wherein $R^3$ and $R^4$ are each individually aryl groups.
70. The composition of paragraph 67, wherein G is C=O and $R^3$ and $R^4$ are each individually aryl groups.
71. The composition of any of paragraphs 1 through 70, wherein $R^3$ and $R^4$ are both phenyl groups and are tethered together via a CO, a S or a $CH_2$.
72. The composition of any of paragraphs 1 through 70, wherein $R^3$ and $R^4$ are both phenyl groups and include at least one $CH_3OCH_2CH_2O-$.

73. A composition comprising a formula:

wherein L is $(-OCH_2CH_2O-)_{qq}$;
T is $(-CH_2-)_x$;
$R^1$ is a hydrogen atom, an alkyl, alkyloxyalkyl, aryl, aryloxyalkyl or aryloxyaryl group;
X is O, S, or $NR^8R^9$;
P is a hydrogen atom or a protecting group, with the provisio that P is absent when X is $NR^8R^9$;
$R^2$ is a hydrogen atom, an alkyl, alkyloxyalkyl, aryl, aryloxylalkyl or aryloxyaryl group;
G is O, S, SO, $SO_2$, $NR^{10}$, $(CH_2)_t-O-$ or C=O;
$R^3$ and $R^4$ are each independently an alkyl, aryl, arylalkyl, heteroaryl, or an heteroarylalkyl group, or optionally, $R^3$ and $R^4$ can be tethered together via $(-CH_2-)_q$, $(-CH_2-)_r C=O(-CH_2-)_s$, $(-CH_2-)_rS(-CH_2-)_s$, $(-CH_2-)_r S=O(-CH_2-)_s$ or $(-CH_2-)_rS(O)_2(-CH_2-)_s$, $(-CH_2-)_rNR(-CH_2-)_s$;
$R^{10}$ is a hydrogen atom or an alkyl, aryl or arylalkyl group;
$R^8$ and $R^9$ are each independently a hydrogen atom, an alkyl, aryl, or arylalkyl group;
R is a hydrogen atom, an alkyl or aryl group;
q is an integer from 1 to about 7;
r is an integer from 0 to about 3;
s is an integer from 0 to about 3;
m is an integer from 2 to about 10;
t is an integer from 1 to about 10;
x is an integer from 1 to about 500;
qq is an integer from 1 to about 500; and
an initiator.

74. The composition of paragraph 73, wherein $R^1$ is H, X is O, P is H, $R^2$ is H, G is O, $R^3$ and $R^4$ are aryl groups, m is 2, x is an integer from 1 to 10 and qq is an integer from 1 to about 10.

75. A composition comprising a crosslinker comprising at least two pendant photoactive groups and an initiator.

76. The compositions of any of paragraphs 1 through 75, wherein the initiator is a photoinitiator.

77. The compositions of any of paragraphs 1 through 75, wherein the initiator is a thermal initiator.

78. The compositions of any of paragraphs 1 through 75, wherein the initiator is a mixture of two of more initiators.

79. A method to modify a substrate comprising the step of applying a composition of any of paragraphs 1 through 78 to a substrate and subjecting the composition to an energy source sufficient to cure the composition into a coating.

80. A composition comprising a formula:

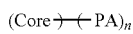

wherein "core" is a linear or branched alkyl group, a linear or branched alkyenyl group, an aryl group, a sugar substrate, a polysaccharide substrate, a peptides, proteins, nucleic acids, oligonucleotides, polyacrylics, polyvinyls, nylons, polyurethanes, or polyethers;
each "PA", independently, is a photoactivatable group that can be an aryl ketone, an azide, a free radical generator, a carbene or a diazo moiety;
"n" is an integer of at least 2; and an initiator.

81. The composition of paragraph 80, wherein the linear or branched alkyl group is a carbon chain of between 2 and about 10 carbon atoms and n is 2 through 5,000.

82. The composition of paragraph 80, wherein the linear or branched alkylenyl group is a carbon atom chain of between 4 and about 10 carbon atoms and there is at least one degree of unsaturation and n is 2 through 5,000.

83. The composition of paragraph 80, wherein the aryl group is phenyl, anthracene or naphthalene and n is 2 or 3.

84. The composition of paragraph 80, wherein the sugar substrate is one of sucrose, lactose, fructose, glucose, or xylose and n is 2 through 5,000.

85. The composition of paragraph 80, wherein the polysaccharide substrate is one of amylose, amylopectin, cellulose or a glycosaminoglycan and n is 2 through 5,000.

86. The compositions of any of paragraphs 80 through 55, wherein the initiator is a mixture of two of more initiators.

87. A method to modify a substrate comprising the step of applying a composition of any of paragraphs 80 through 86 to a substrate and subjecting the composition to an energy source sufficient to cure the composition into a coating.

The invention will be further described with reference to the following non-limiting Examples. It will be apparent to those skilled in the art that many changes can be made in the embodiments described without departing from the scope of the present invention. Thus the scope of the present invention should not be limited to the embodiments described in this application, but only by embodiments described by the language of the claims and the equivalents of those embodiments. Unless otherwise indicated, all percentages are by weight.

EXAMPLES

Example 1

Synthesis of Trifunctional Triazine Crosslinker 1.2 g (4 mmol) of triglycidyl isocyanurate (Aldrich Chemicals, Milwaukee, Wis.) and 2.4 g (12 mmol) of 4-hydroxybenzophenone (Aldrich Chemicals, Milwaukee, Wis.) were mixed in a 50-ml round bottom flask containing a magnetic stir bar. The flask was flushed with argon for 10 min and heated to 130° C. in an oil bath. Once the reaction mixture melted, 6 mg (0.02 mmol) of triphenylphosphine (Aldrich Chemicals, Milwaukee, Wis.) was added. The mixture was stirred for another 2 minutes under argon and cooled to room temperature. The reaction residue was dissolved in 30 ml chloroform, then washed with 4N NaOH (30 ml×3) and deionized water (30 ml×3). The organic layer was dried over magnesium sulfate and concentrated to dryness on the under reduced pressure. The product was purified by column chromatography (silica gel, 230-400 mesh, Whatman, Inc.) using ethyl acetate as eluent ($R_f$~4.5). The fractions containing the pure product were combined and concentrated under reduced pressure and a white powder was obtained after drying under vacuum (yield 70%).

The crosslinker (Crosslinker TFT) is soluble in most common solvents including chloroform, methylene chloride, acetone, ethyl acetate, isopropanol, etc. $^1$H NMR (CDCl$_3$) confirmed the structure of the product. The peaks at d 7.78 ppm (m, 12H), 7.46 ppm (m, 9H), 6.98 ppm (m, 6H) were the typical signals from 4-substituted benzophenone. The peak at d 4.35 ppm (m, 6H) was assigned to the protons of methylene connected to phenoxy group. The peak at d 4.13 ppm (m, 9H) was a combination of 6 protons of 3 methylene groups connected to nitrogen atom and 3 protons from 3 methine groups. The peak at d 3.00 ppm (s, 3H) corresponded to hydroxyl groups.

This material is referred to as "Crosslinker TFT".

Example 2

Solutions of three different photoinitiators with crosslinker TFT were prepared, as well as a control crosslinker TFT only solution. Solution 1: 10 mg/ml crosslinker TFT in acetone. Solution 2: 8 mg/ml 1-hydroxycyclohexyl phenyl ketone (Aldrich Chemicals, Milwaukee, Wis.) 2 mg/ml crosslinker TFT in acetone. Solution 3: 8 mg/ml benzophenone (Aldrich Chemicals, Milwaukee, Wis.) 2 mg/ml crosslinker TFT in acetone. Solution 4: 8 mg/ml 4,4'bis[2-(1-propenyl)phenoxy]benzophenone (Aldrich Chemicals, Milwaukee, Wis.) 2 mg/ml crosslinker TFT in acetone. Solution 5: 9 mg/ml 1-hydroxycyclohexyl phenyl ketone (Aldrich Chemicals, Milwaukee, Wis.) 1 mg/ml crosslinker TFT in acetone. Solution 6: 9 mg/ml benzophenone (Aldrich Chemicals, Milwaukee, Wis.) 1 mg/ml crosslinker TFT in acetone. Solution 7: 9 mg/ml 4,4'bis[2-(1-propenyl)phenoxy]benzophenone (Aldrich Chemicals, Milwaukee, Wis.) 1 mg/ml crosslinker TFT in acetone.

The primers were coated onto PEBAX 72D rod stock (Minnesota MedTech, MN). The rod stock was cut into x inch long segments, then cleaned by wiping with isopropanol with a tex-wipe, then air dried. Three pieces of PEBAX 72D rod stock were coated for each of the seven solutions by dipping the rod into the solution, dwelling in the solution for 30 seconds, then extracting at a speed of 2 cm/sec and air dried for 5 minutes. All pieces were illuminated for 1 minute with a UV4000 lamp (Harland Medical Systems, Eden Prairie, Minn.).

All pieces were then coated with a lubricious topcoat, Lubricent LB010200 (Harland Medical Systems, Eden Prairie, Minn.) by dipping into the coating solution, dwelling in the solution for 30 seconds, then extracting at a speed of 2 cm/sec and air dried for 10 minutes. All pieces were illuminated for 5 minutes with a UV4000 lamp (Harland Medical Systems, Eden Prairie, Minn.).

All pieces were tested for lubricity using a FTS5000 Friction Tester (Harland Medical Systems, Eden Prairie, Minn.). The pieces were pulled through silicone pads clamped together with 500 g normal force under aqueous conditions at a rate of 2 cm/sec. The force for each pull through the clamps was measured, the pull was then repeated for a total of 15 cycles. At 500 g normal force an average force test result of below 25 g is considered a passing result.

| Solution # | 1 | 2 | 3 | 4 | 5 | 6 | 7 |
|---|---|---|---|---|---|---|---|
| Photoinitiator | none | HCPK | BP | PPB | HCPK | BP | PPB |
| Ratio PI:TFT | 0:10 | 8:2 | 8:2 | 8:2 | 9:1 | 9:1 | 9:1 |
| Ave Force (g) | 15.2 ± 4.5 | 19.0 ± 3.3 | 17.6 ± 5.0 | 17.6 ± 4.9 | 24.6 ± 6.0 | 43.1 ± 9.6 | 15.6 ± 4.7 |
| Max Force (g) | 32.6 ± 9.6 | 35.0 ± 9.3 | 28.3 ± 9.4 | 27.6 ± 12.7 | 42.1 ± 8.9 | 67.4 ± 10.6 | 22.7 ± 6.6 |

HCPK: 1-hydroxycyclohexyl phenyl ketone
BP: benzophenone
PPB: 4,4'bis[2-(1-propenyl)phenoxy]benzophenone Example 3

Primer solutions were made up to vary the amount of initiator versus the amount of photocrosslinker while keeping the combined mass concentration constant:

| Solution # | HCPK initiator concentration in mg/ml | Crosslinker TFT concentration in mg/ml |
| --- | --- | --- |
| 1 | 9 | 1 |
| 2 | 9.5 | 0.5 |
| 3 | 9.75 | 0.25 |
| 4 | 10 | 0 |
| 5 | 19 | 1 |
| 6 | 19.5 | 0.5 |
| 7 | 19.75 | 0.25 |
| 8 | 20 | 0 |

All solutions were in isopropanol. Solution 9, 10 mg/ml crosslinker TFT in acetone was used as a control.

Primer solutions were coated onto PEBAX 72D rod stock (Minnesota MedTech, MN) previously cleaned by wiping with isopropanol. The cleaned PEBAX 72D tubing was dipped into a primer solution, they dwelled in the solution for 30 seconds, then were extracted at a speed of 1 cm/sec and air dried for 5 minutes. All pieces were illuminated for 1 minute with a UV4000 lamp (Harland Medical Systems, Eden Prairie, Minn.). Sample pieces were then coated with a lubricious topcoat, Lubricent LB010200 (Harland Medical Systems, Eden Prairie, Minn.) by dipping into the coating solution, dwelling in the solution for 30 seconds, then extracting at a speed of 1 cm/sec and air dried for 10 minutes. All pieces were illuminated for 5 minutes with a UV4000 lamp (Harland Medical Systems, Eden Prairie, Minn.).

All pieces were tested for lubricity using a FTS5000 Friction Tester (Harland Medical Systems, Eden Prairie, Minn.) with a clamp force of 500 g over 15 cycles. At 500 g normal force an average force test result of below 25 g is considered a passing result.

| Solution # | [initiator] | [cross-linker] | Ave Force (g) | Max Force (g) |
| --- | --- | --- | --- | --- |
| 1 | 9 | 1 | 14.0 ± 9.7 | 38.0 ± 42.7 |
| 2 | 9.5 | 0.5 | 11.0 ± 2.1 | 18.3 ± 4.7 |
| 3 | 9.75 | 0.25 | 55.4 ± 19.9 | 148.9 ± 100.7 |
| 4 | 10 | 0 | 204.8 ± 66.5 | 279.5 ± 0.2 |
| 5 | 19 | 1 | 11.0 ± 1.5 | 25.5 ± 15.0 |
| 6 | 19.5 | 0.5 | 41.0 ± 23.0 | 70.0 ± 40.9 |
| 7 | 19.75 | 0.25 | 80.0 ± 30.9 | 132.4 ± 34.3 |
| 8 | 20 | 0 | 159.3 ± 39.7 | 239.2 ± 69.6 |
| 9 | 0 | 10 | 12.8 ± 2.1 | 15.9 ± 2.2 |

Example 4

Two primer solutions were made up—solution 1 is 9.5 mg/ml 1-hydroxycyclohexyl phenyl ketone (HCPK), 0.5 mg/ml crosslinker TFT in isopropanol, solution 2 is 10 mg/ml crosslinker TFT in acetone. Five substrates were coated: PEBAX, PEBAX 72D, Grilamid (nylon), high density polyethylene (HDPE), and polyethylene terephthalate (PET) (all rod stock from Minnesota MedTech, MN). Each substrate was cleaned, coated and tested as in Example 3.

| | Solution 1 | | Solution 2 | |
| --- | --- | --- | --- | --- |
| Substrate | Ave. force (g) | Max force (g) | Ave. force (g) | Max force (g) |
| PEBAX | 13.3 ± 22.4 | 19.8 ± 27.8 | 9.8 ± 5.4 | 23.1 ± 13.7 |
| PEBAX 72D | 2.4 ± 0.6 | 4.3 ± 0.9 | 13.5 ± 10.8 | 24.1 ± 19.1 |
| Grilamid | 3.5 ± 1.2 | 9.9 ± 5.4 | 13.2 ± 5.0 | 28.4 ± 11.4 |
| HDPE | 2.9 ± 0.8 | 4.5 ± 1.0 | 3.5 ± 0.9 | 7.6 ± 3.2 |
| PET | 4.7 ± 1.2 | 12.5 ± 6.2 | 3.5 ± 0.9 | 6.2 ± 1.4 |

Example 5

A primer solution was made up at 9.5 mg/ml 1-hydroxycyclohexyl phenyl ketone (HCPK), 0.5 mg/ml crosslinker TFT in isopropanol. Stainless Steel 304V wire was cleaned by wiping with isopropanol. The wire was then coated by dipping in the primer solution, they dwelled in the solution for 30 seconds, then were extracted at a speed of 1 cm/sec and air dried for 5 minutes. All pieces were illuminated for 1 minute with a UV4000 lamp (Harland Medical Systems, Eden Prairie, Minn.). Sample pieces were then coated with a lubricious topcoat, Lubricent LB010200 (Harland Medical Systems, Eden Prairie, Minn.) by dipping into the coating solution, dwelling in the solution for 30 seconds, then extracting at a speed of 1 cm/sec and air dried for 10 minutes. All pieces were illuminated for 5 minutes with a UV4000 lamp (Harland Medical Systems, Eden Prairie, Minn.).

All pieces were tested for lubricity using a FTS5000 Friction Tester (Harland Medical Systems, Eden Prairie, Minn.) with a clamp force of 500 g over 15 cycles. At 500 g normal force an average force test result of below 25 g is considered a passing result.

| Coating | Average Force (g) | Max Force (g) |
| --- | --- | --- |
| LB200 | 31.3 ± 15.6 | 63.6 ± 31.9 |
| Primer + LB200 | 6.3 ± 3.9 | 23.2 ± 12.2 |

Example 6

Primer solutions were made from Coumarin, tert-Butyl peroxide, 1-Hydroxycyclohexylphenyl ketone (Aldrich Chemical, Milwaukee, Wis.) as initiators at 9.5 mg/mL with crosslinker TFT at 0.5 mg/mL in isopropanol. Grilamid was cleaned by wiping with isopropanol. The Grilamid was then coated by dipping in the primer solution, they dwelled in the solution for 30 seconds, then were extracted at a speed of 1 cm/sec. and air dried for 5 minutes. All pieces were illuminated for 1 minute with a UV4000 lamp (Harland Medical Systems, Eden Prairie, Minn.). Alternately for heat initiated reactions after air drying the pieces were cured at 90° C. for 1 hour. Sample pieces were then coated with a lubricious topcoat, Lubricent LB010200 (Harland Medical Systems, Eden Prairie, Minn.) by dipping into the coating solution, dwelling in the solution for 30 seconds, then extracting at a speed of 1 cm/sec and air dried for 10 minutes. All pieces were illuminated for 5 minutes with a UV4000 lamp (Harland Medical Systems, Eden Prairie, Minn.).

All pieces were tested for lubricity using a FTS5000 Friction Tester (Harland Medical Systems, Eden Prairie, Minn.) with a clamp force of 500 g over 15 cycles. At 500 g normal force an average force test result of below 25 g is considered a passing result.

Photo Cured Initiator Results

| Initiator + Crosslinker TFT | Average Force (g) | Max Force (g) |
|---|---|---|
| Coumarin | 16.3 ± 17.5 | 27.6 ± 22.6 |
| tert-Butyl peroxide | 73.3 ± 30.1 | 90.1 ± 32.2 |
| 1-Hydroxycyclohexylphenyl ketone | 10.2 ± 12.2 | 22.4 ± 22.6 |
| No initiator Crosslinker TFT @ 0.5 mg/mL | 33.5 ± 28.0 | 53.0 ± 42.8 |

Heat Cured Initiator Results

| Initiator + Crosslinker TFT | Average Force (g) | Max Force (g) |
|---|---|---|
| tert-Butyl peroxide | 19.9 ± 9.9 | 50.1 ± 25.2 |

Example 7

Primer solutions were made from 1-Hydroxycyclohexylphenyl ketone at 9.5 mg/mL and one of the following crosslinkers: 2-(4-Methoxystyryl)-4,6-bis(trichloromethyl)-1,3,5-triazine (Aldrich Chemical, Milwaukee, Wis.), or 2,6-Bis(4-azidobenzylidene)-4-methylcyclohexanone (Aldrich Chemical, Milwaukee, Wis.) at 0.5 mg/mL in isopropanol. The Grilamid was then coated by dipping in the primer solution, they dwelled in the solution for 30 seconds, then were extracted at a speed of 1 cm/sec. and air dried for 5 minutes. All pieces were illuminated for 1 minute with a UV4000 lamp (Harland Medical Systems, Eden Prairie, Minn.). Sample pieces were then coated with a lubricious topcoat, Lubricent LB010200 (Harland Medical Systems, Eden Prairie, Minn.) by dipping into the coating solution, dwelling in the solution for 30 seconds, then extracting at a speed of 1 cm/sec and air dried for 10 minutes. All pieces were illuminated for 5 minutes with a UV4000 lamp (Harland Medical Systems, Eden Prairie, Minn.).

All pieces were tested for lubricity using a FTS5000 Friction Tester (Harland Medical Systems, Eden Prairie, Minn.) with a clamp force of 500 g over 15 cycles. At 500 g normal force an average force test result of below 25 g is considered a passing result.

| 1-Hydroxycyclohexylphenyl ketone + Crosslinker | Average Force (g) | Max Force (g) |
|---|---|---|
| 2-(4-Methoxystyryl)-4,6-bis(trichloromethyl)-1,3,5-triazine | 3.4 ± 0.8 | 6.3 ± 3.3 |
| 2,6-Bis(4-azidobenzylidene)-4-methylcyclohexanone | 3.9 ± 1.4 | 11.8 ± 10.5 |

Although the present invention has been described with reference to preferred embodiments, persons skilled in the art will recognize that changes may be made in form and detail without departing from the spirit and scope of the invention. All references cited throughout the specification, including those in the background, are incorporated herein in their entirety. Those skilled in the art will recognize, or be able to ascertain, using no more than routine experimentation, many equivalents to specific embodiments of the invention described specifically herein. Such equivalents are intended to be encompassed in the scope of the following claim.

What is claimed is:

1. A primer coating for enhancing adhesion of a subsequent coating to a surface, the primer coating consisting of a combination of:
    (a) a crosslinking agent comprising at least two pohotoactivatabl groups attached to a molecule and having a formula

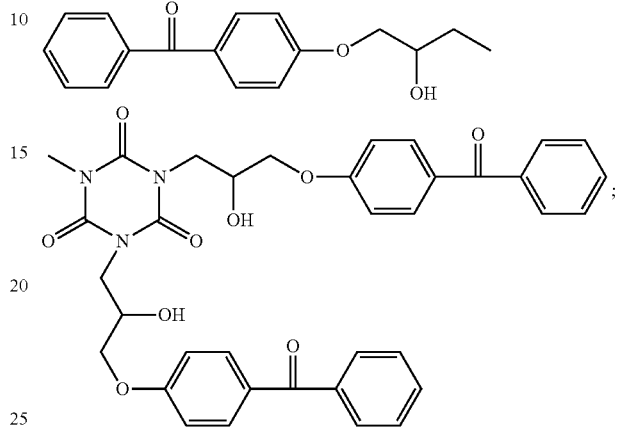

and
    (b) an initiator, wherein the initiator is not a photoactivatable crosslinker; wherein the primer coating comprises crosslinking agent in an amount in a range of 0.5 mg/ml to 1 mg/ml,
    wherein the initiator is present in the primer coating in an amount in a range of 9 mg/ml to 19 mg/ml, and
    wherein at least some of the photoactivatable groups of the crosslinker, at least some free radical generators of the initiator, or a combination of photoactivatable groups and free radical generators within the primer coating, are in an unreacted state and adhere the subsequent coating to the surface.

2. The primer coating of claim 1, wherein the initiator is a photoinitiator.

3. The primer coating of claim 2, wherein the photoinitiator is selected from peroxides, peroxy compounds, benzoin derivatives, aryl ketones, and coumarin.

4. The primer coating of claim 1, wherein the initiator is a thermal initiator.

5. The primer coating of claim 1, wherein the initiator is a mixture of two or more initiators.

6. A primer coating for enhancing adhesion of a lubricious coating to a surface, the primer coating consisting of a combination of:
    (a) a crosslinking agent comprising at least two photoactivatable groups attached to a molecule, and
    (b) an initiator, wherein the initiator is not a photoactivatable crosslinker; wherein the crosslinking agent has a formula

wherein L is a linking group;
T is $(-CH_2-)_x$, $(-CH_2CH_2-O-)_x$, $(-CH_2CH_2CH_2-O-)_x$, $(-CH_2CH_2CH_2CH_2-O-)_x$ or forms a bond;
$R^1$ is a hydrogen atom, an alkyl, alkyloxyalkyl, aryl, aryloxyalkyl or aryloxyaryl group;
X is O, S, or $NR^8R^9$;
P is a hydrogen atom or a protecting group, with the proviso that P is absent when X is $NR^8R^9$;

$R^2$ is a hydrogen atom, an alkyl, alkyloxyalkyl, aryl, aryloxylalkyl or aryloxyaryl group;

G is O, S, SO, $SO_2$, $NR^{10}$, $(CH_2)_t$—O— or C=O;

$R^3$ and $R^4$ are each independently an alkyl, aryl, arylalkyl, heteroaryl, or an heteroarylalkyl group, or optionally, $R^3$ and $R^4$ can be tethered together via $(—CH_2—)_q$, $(—CH_2—)_rC=O(—CH_2—)_s$, $(—CH_2—)_rS(—CH_2—)_s$, $(—CH_2—)_rS=O(—CH_2—)_s$ or $(—CH_2—)_rS(O)_2(—CH_2—)_s$, $(—CH_2—)_rNR(—CH_2—)_s$;

$R^{10}$ is a hydrogen atom or an alkyl, aryl or arylalkyl group;

$R^8$ and $R^9$ are each independently a hydrogen atom, an alkyl, aryl, or arylalkyl group;

R is a hydrogen atom, an alkyl or aryl group;

q is an integer from 1 to about 7;

r is an integer from 0 to about 3;

s is an integer from 0 to about 3;

m is an integer from 2 to about 10;

t is an integer from 1 to about 10;

x is an integer from 1 to about 500;

wherein the primer coating comprises crosslinking agent in an amount in a range of 0.5 mg/ml 1 mg/ml, wherein the initiator is present in the primer coating in an amount in a range of 9 mg/ml to 19 mg/ml, and wherein at least some of the photoactivatable groups of the crosslinker, at least some free radical generators of the initiator, or a combination of photoactivatable groups and free radical generators within the primer coating, are in an unreacted state and adhere the lubricious coating to the surface.

7. The primer coating of claim 6, wherein L has a formula according to structure (I):

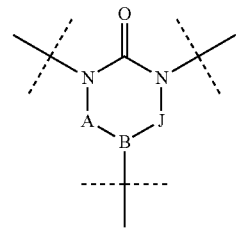

(I)

wherein A and J are each independently a hydrogen atom, an alkyl group, an aryl group, or together with B form a cyclic ring, provided when A and J are each independently a hydrogen atom, an alkyl group, or an aryl group then B is not present;

B is $NR^{11}$, O, or $(—CH_2—)_z$;

provided when A, B and J form a ring, then A and J are $(—CH_2—)_z$ or C=O;

$R^{11}$ is a hydrogen atom, an alkyl group, an aryl group or denotes a bond with T;

each z independently is an integer from 0 to 3; and provided when either A or J is C=O, then B is $NR^{11}$, O, or $(—CH_2—)_z$ and z must be at least 1.

8. The primer coating of claim 7, wherein A and J are both C=O and B is N.

9. The primer coating of claim 6, wherein $R^3$ and $R^4$ are each individually aryl groups.

10. The primer coating of claim 6, wherein the initiator is a photoinitiator.

11. The primer coating of claim 6, wherein the initiator is a thermal initiator.

12. The primer coating of claim 6, wherein the initiator is a mixture of two or more initiators.

13. The primer coating of claim 6, wherein the photoinitiator is selected from peroxides, peroxy compounds, benzoin derivatives, aryl ketones, and coumarin.

* * * * *

UNITED STATES PATENT AND TRADEMARK OFFICE
CERTIFICATE OF CORRECTION

PATENT NO. : 9,809,713 B2
APPLICATION NO. : 13/062218
DATED : November 7, 2017
INVENTOR(S) : Timothy A. Bloomquist et al.

It is certified that error appears in the above-identified patent and that said Letters Patent is hereby corrected as shown below:

On the Title Page

At (73), the name of the Assignee "INNOVATION SURFACE TECHNOLOGIES, INC.," should read -- INNOVATIVE SURFACE TECHNOLOGIES, INC., --.

In the Claims

Column 38, Line 57, Claim 6 the formula reading "L(T-C($R^1$)(XP)$CHR^2GR^3$C(=O)$R^4$)$_m$" should read -- L-(T-C($R^1$)(XP)$CHR^2GR^3$C(=O)$R^4$)$_m$ --.

Column 39, Line 7, Claim 6 the formula reading "(–$CH_2$–)rC=O(–$CH_2$–)s" should read -- (–$CH_2$–)$_r$C=O(–$CH_2$–)$_s$ --; Line 8, the formula reading "(–$CH_2$–)$_r$S=O(–$CH_2$–)s" should read -- (–$CH_2$–)$_r$S=O(–$CH_2$–)$_s$ --; Lines 8–9, the formula reading "(–$CH_2$–)rS(O)$_2$(–$CH_2$–)$_s$" should read -- (–$CH_2$–)$_r$S(O)$_2$(–$CH_2$–)$_s$ --.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*